US012266574B2

(12) United States Patent
Teng et al.

(10) Patent No.: US 12,266,574 B2
(45) Date of Patent: Apr. 1, 2025

(54) FLOWABLE CHEMICAL VAPOR DEPOSITION (FCVD) USING MULTI-STEP ANNEAL TREATMENT AND DEVICES THEREOF

(71) Applicant: Taiwan Semiconductor Manufacturing Co., Ltd., Hsinchu (TW)

(72) Inventors: Yun Chen Teng, New Taipei (TW); Chen-Fong Tsai, Hsinchu (TW); Li-Chi Yu, Jhubei (TW); Huicheng Chang, Tainan (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 407 days.

(21) Appl. No.: 17/738,527

(22) Filed: May 6, 2022

(65) Prior Publication Data
US 2023/0042726 A1  Feb. 9, 2023

Related U.S. Application Data

(60) Provisional application No. 63/230,111, filed on Aug. 6, 2021.

(51) Int. Cl.
*H01L 21/3105* (2006.01)
*H01L 21/8234* (2006.01)
(Continued)

(52) U.S. Cl.
CPC ........... *H01L 21/823481* (2013.01); *H01L 21/31053* (2013.01); *H01L 29/0665* (2013.01);
(Continued)

(58) Field of Classification Search
CPC ....... H01L 21/823481; H01L 21/31053; H01L 29/0665; H01L 29/42392; H01L 29/7851; H01L 29/78696; H01L 29/0847; H01L 29/1079; H01L 29/165; H01L 29/6681; H01L 29/7848; H01L 29/0673; H01L 29/66439; H01L 29/775; H01L 21/76229;
(Continued)

(56) References Cited

U.S. PATENT DOCUMENTS 9,177,955 B2 * 11/2015 Peng ................. H01L 29/7831
9,406,547 B2 *  8/2016 Jhaveri ............. H01L 29/0649
(Continued)

*Primary Examiner* — David Vu
(74) *Attorney, Agent, or Firm* — Slater Matsil, LLP

(57) ABSTRACT

FCVD using multi-step anneal treatment and devices thereof are disclosed. In an embodiment, a method includes depositing a flowable dielectric film on a substrate. The flowable dielectric film is deposited between a first semiconductor fin and a second semiconductor fin. The method further includes annealing the flowable dielectric film at a first anneal temperature for at least 5 hours to form a first dielectric film, annealing the first dielectric film at a second anneal temperature higher than the first anneal temperature to form a second dielectric film, annealing the second dielectric film at a third anneal temperature higher than the first anneal temperature to form an insulating layer, applying a planarization process to the insulating layer, and etching the insulating layer to STI regions on the substrate.

20 Claims, 41 Drawing Sheets

(51) Int. Cl.
  *H01L 29/423*  (2006.01)
  *H01L 29/786*  (2006.01)
  *H01L 29/06*   (2006.01)
  *H01L 29/78*   (2006.01)

(52) U.S. Cl.
  CPC .... *H01L 29/42392* (2013.01); *H01L 29/7851* (2013.01); *H01L 29/78696* (2013.01)

(58) Field of Classification Search
  CPC .............. H01L 27/088; H01L 21/0214; H01L 21/02219; H01L 21/02337; H01L 21/02345; H01L 21/3105; H01L 29/66545; H01L 21/02271; B82Y 10/00
  See application file for complete search history.

(56) References Cited

U.S. PATENT DOCUMENTS

| | | | |
|---|---|---|---|
| 9,552,978 B1* | 1/2017 | Huang | H01L 29/785 |
| 9,634,118 B2 | 4/2017 | Kim | |
| 9,728,402 B2* | 8/2017 | Wang | H01L 29/66795 |
| 9,831,098 B2* | 11/2017 | Dou | H01L 29/66795 |
| 2011/0151677 A1* | 6/2011 | Wang | H01L 21/02343 |
| | | | 257/E21.283 |
| 2017/0053996 A1 | 2/2017 | Kim | |

* cited by examiner

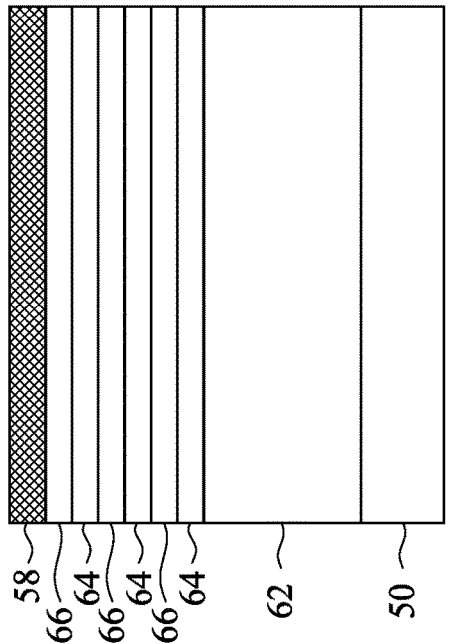
Figure 15A
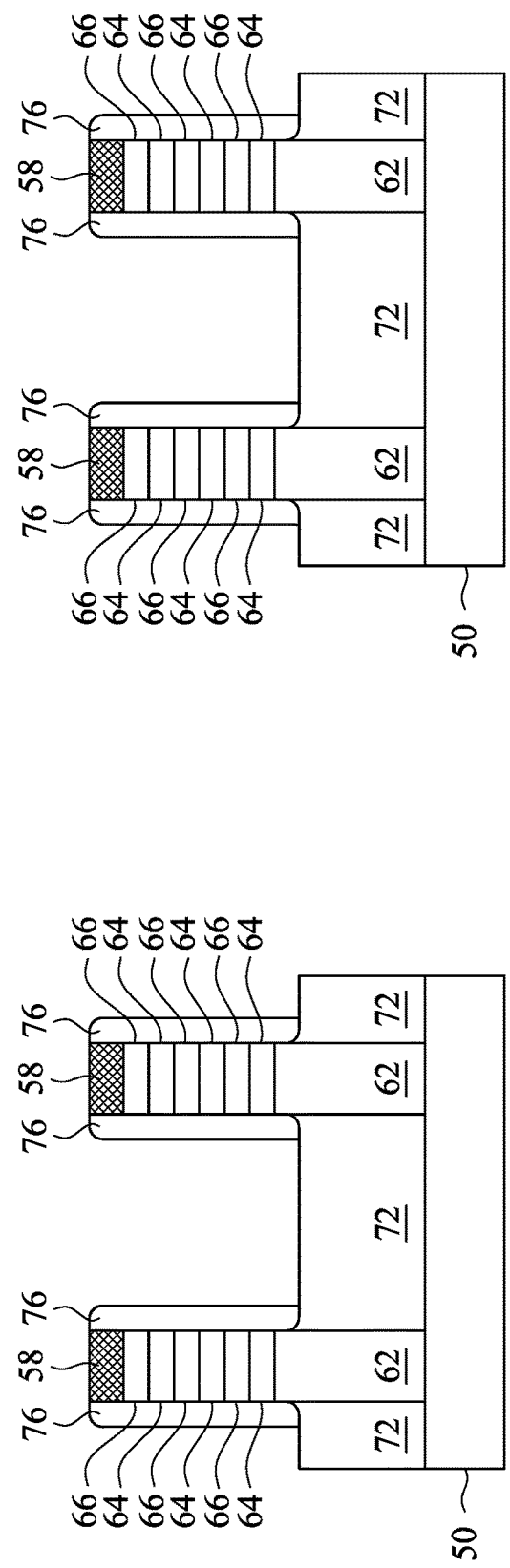
Figure 15B
Figure 15C

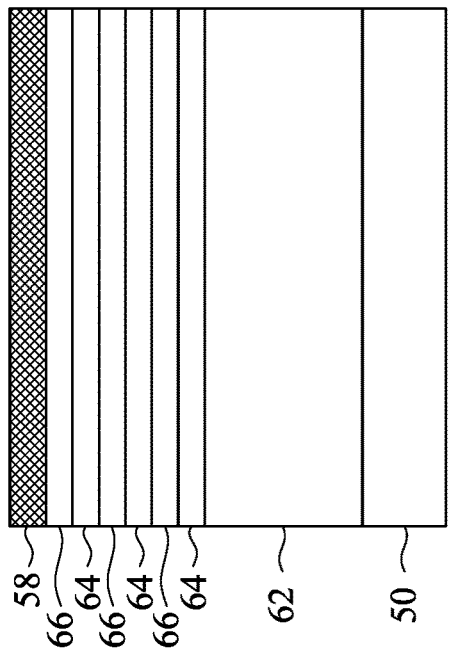
Figure 17A
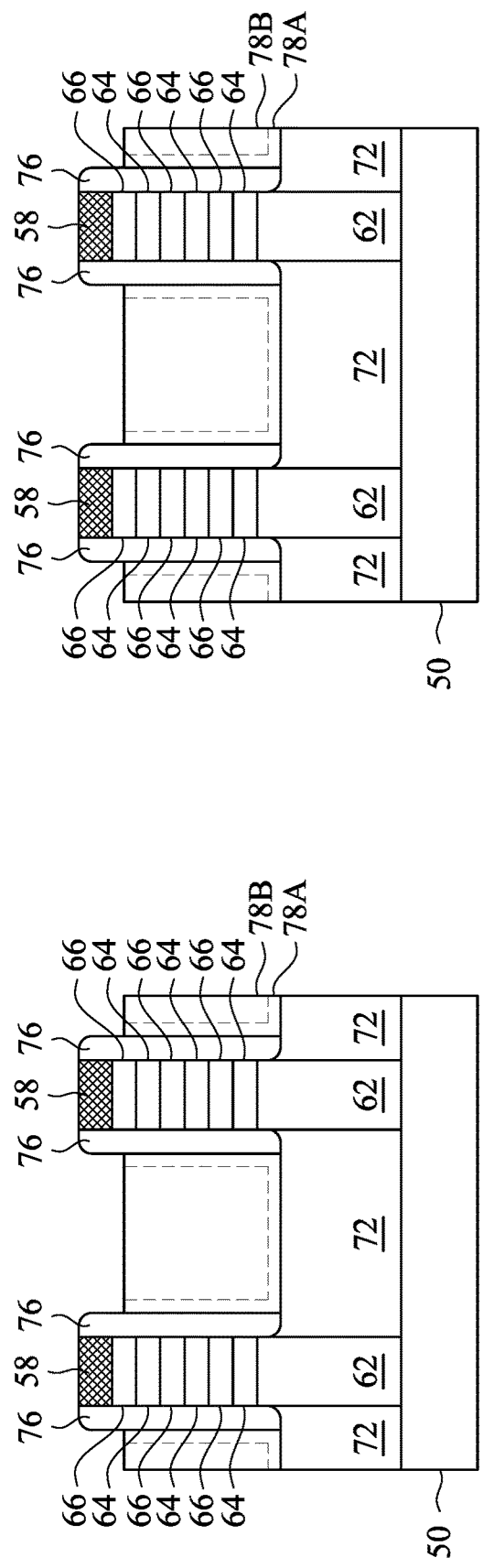
Figure 17C
Figure 17B

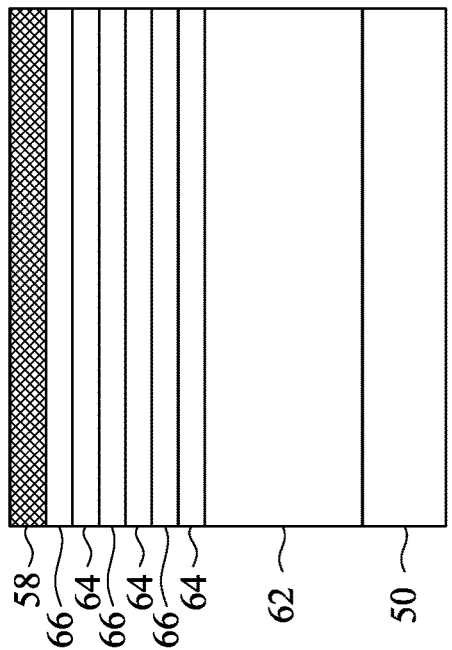
Figure 18A
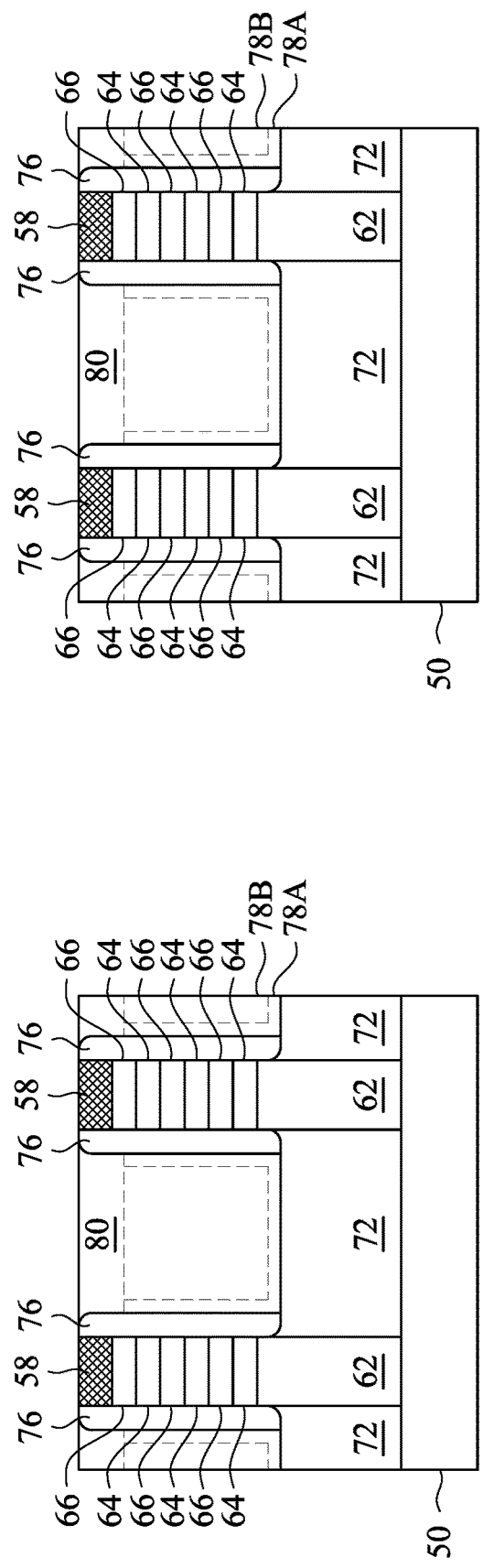
Figure 18C
Figure 18B

US 12,266,574 B2

FLOWABLE CHEMICAL VAPOR DEPOSITION (FCVD) USING MULTI-STEP ANNEAL TREATMENT AND DEVICES THEREOF

PRIORITY CLAIM AND CROSS-REFERENCE

This application claims the benefit of U.S. Provisional Application No. 63/230,111, filed on Aug. 6, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4, 5, 6, 7, 8, 9, 10, 12, 13, 14A, 14B, 14C, 15A, 15B, 15C, 16A, 16B, 16C, 17A, 17B, 17C, 18A, 18B, 18C, 19A, 19B, 19C, 20A, 20B, 20C, 21A, 21B, 21C, 22A, 22B, 22C, 23A, 23B, 23C, 24A, 24B, 24C, 25A, 25B, 25C, 26A, 26B, 26C, 27A, 27B, 27C, 28A, 28B, 28C, 29A, 29B, 29C, 30A, 30B, and 30C are cross-sectional views of intermediate stages in the manufacturing of nano-FETs, in accordance with some embodiments.

DETAILED DESCRIPTION

Figure 1:
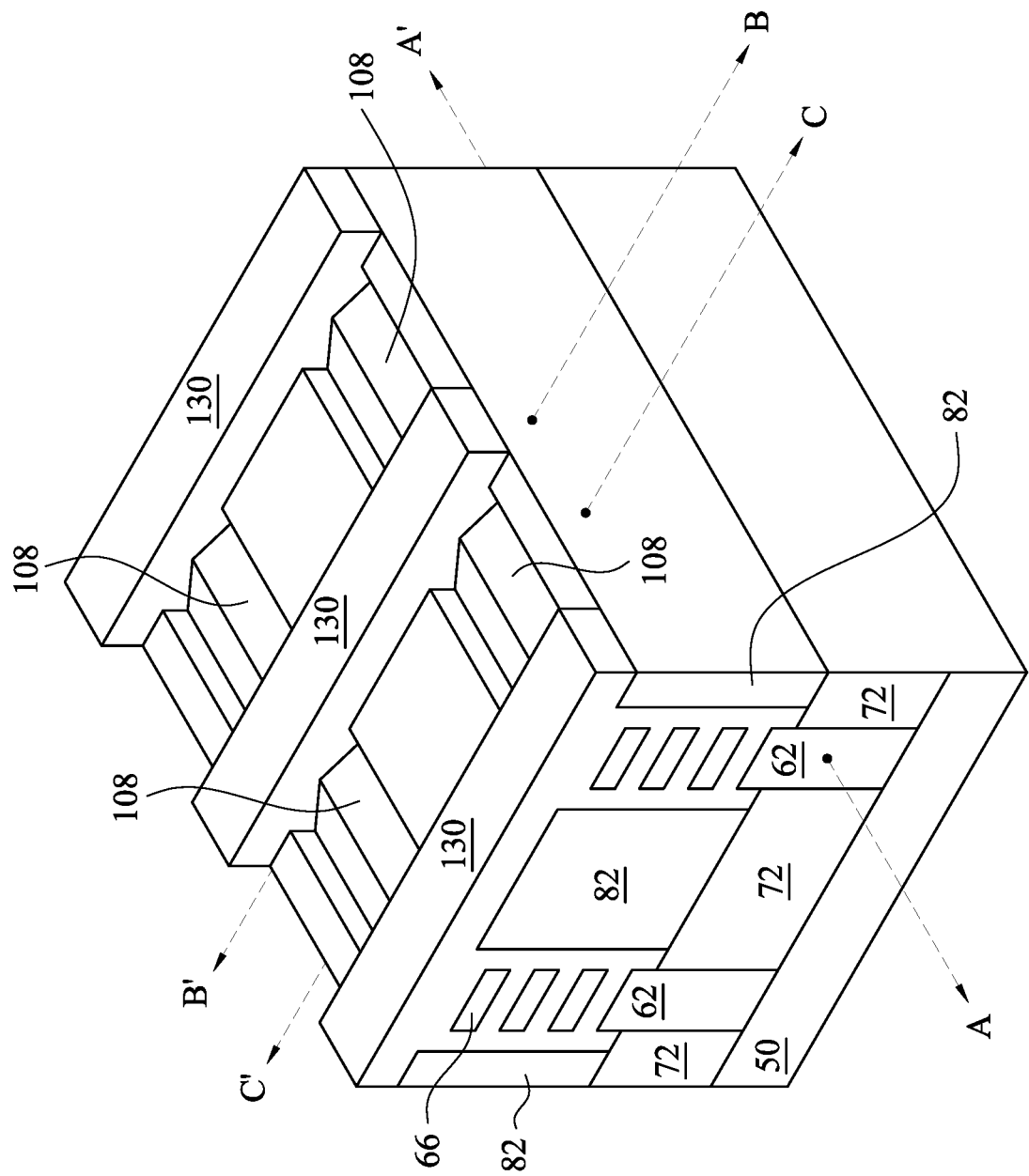
FIG. 1 illustrates an example of nanostructure field-effect transistors (nano-FETs) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods of flowable chemical vapor deposition (FCVD) using a multi-step anneal process, and semiconductor devices thereof. The multi-step anneal process may include a first anneal step that heats a flowable dielectric film using a wet steam at a low temperature for a relatively long time (e.g., for at least five hours). The multi-step anneal process may then include an intermediate anneal step using another wet steam at a higher temperature. The multi-step anneal process may include a final dry anneal step at another higher temperature. The multi-step anneal process can achieve high ratio of FCVD conversion and low nitrogen impurity to improve the FCVD quality (e.g., in terms of impurity level, density, and etch resistance), and the multi-step anneal process may reduce the total thermal budget of forming the device layer, thereby reducing the risk of damaging various features of the semiconductor device.

Embodiments are described in a particular context, a die including nano-FETs. Various embodiments may be applied, however, to dies including other types of transistors (e.g., fin field-effect transistors (FinFETs), planar transistors, or the like) in lieu of or in combination with the nano-FETs.

FIG. 1 illustrates an example of nano-FETs (e.g., nanowire FETs, nanosheet FETs, or the like), in accordance with some embodiments. FIG. 1 is a three-dimensional view, where some features of the nano-FETs are omitted for illustration clarity. The nano-FETs may be nanosheet field-effect transistors (NSFETs), nanowire field-effect transistors (NWFETs), gate-all-around field-effect transistors (GAAFETs), or the like.

The nano-FETs include nanostructures 66 (e.g., nanosheets, nanowires, or the like) over semiconductor fins 62 on a substrate 50 (e.g., a semiconductor substrate), with the nanostructures 66 acting as channel regions for the nano-FETs. The nanostructures 66 may include p-type nanostructures, n-type nanostructures, or a combination thereof. Isolation regions 72, such as shallow trench isolation (STI) regions, are disposed between adjacent semiconductor fins 62, which may protrude above and from between adjacent isolation regions 72. Although the isolation regions 72 are described/illustrated as being separate from the substrate 50, as used herein, the term "substrate" may refer to the semiconductor substrate alone or a combination of the semiconductor substrate and the isolation regions. Additionally, although the bottom portions of the semiconductor fins 62 are illustrated as being separate from the substrate 50, the bottom portions of the semiconductor fins 62 may be single, continuous materials with the substrate 50. In this context, the semiconductor fins 62 refer to the portion extending above and from between the adjacent isolation regions 72.

Gate structures 130 are over top surfaces of the semiconductor fins 62 and along top surfaces, sidewalls, and bottom surfaces of the nanostructures 66. Epitaxial source/drain regions 108 are disposed on the semiconductor fins 62 at opposing sides of the gate structures 130. The epitaxial source/drain regions 108 may be shared between various semiconductor fins 62. For example, adjacent epitaxial source/drain regions 108 may be electrically connected, such as through coupling the epitaxial source/drain regions 108 with a same source/drain contact.

Insulating fins 82, also referred to as hybrid fins or dielectric fins, are disposed over the isolation regions 72, and between adjacent epitaxial source/drain regions 108. The insulating fins 82 block epitaxial growth to prevent coalescing of some of the epitaxial source/drain regions 108 during epitaxial growth. For example, the insulating fins 82 may be formed at cell boundaries to separate the epitaxial source/drain regions 108 of adjacent cells.

FIG. 1 further illustrates reference cross-sections that are used in later figures. Cross-section A-A' is along a longitudinal axis of a semiconductor fin 62 and in a direction of, for example, a current flow between the epitaxial source/drain regions 108 of the nano-FET. Cross-section B-B' is along a longitudinal axis of a gate structure 130 and in a direction, for example, perpendicular to a direction of current flow between the epitaxial source/drain regions 108 of a nano-FET. Cross-section C-C' is parallel to cross-section B-B' and extends through epitaxial source/drain regions 108 of the nano-FETs. Subsequent figures refer to these reference cross-sections for clarity.

Figure 2:
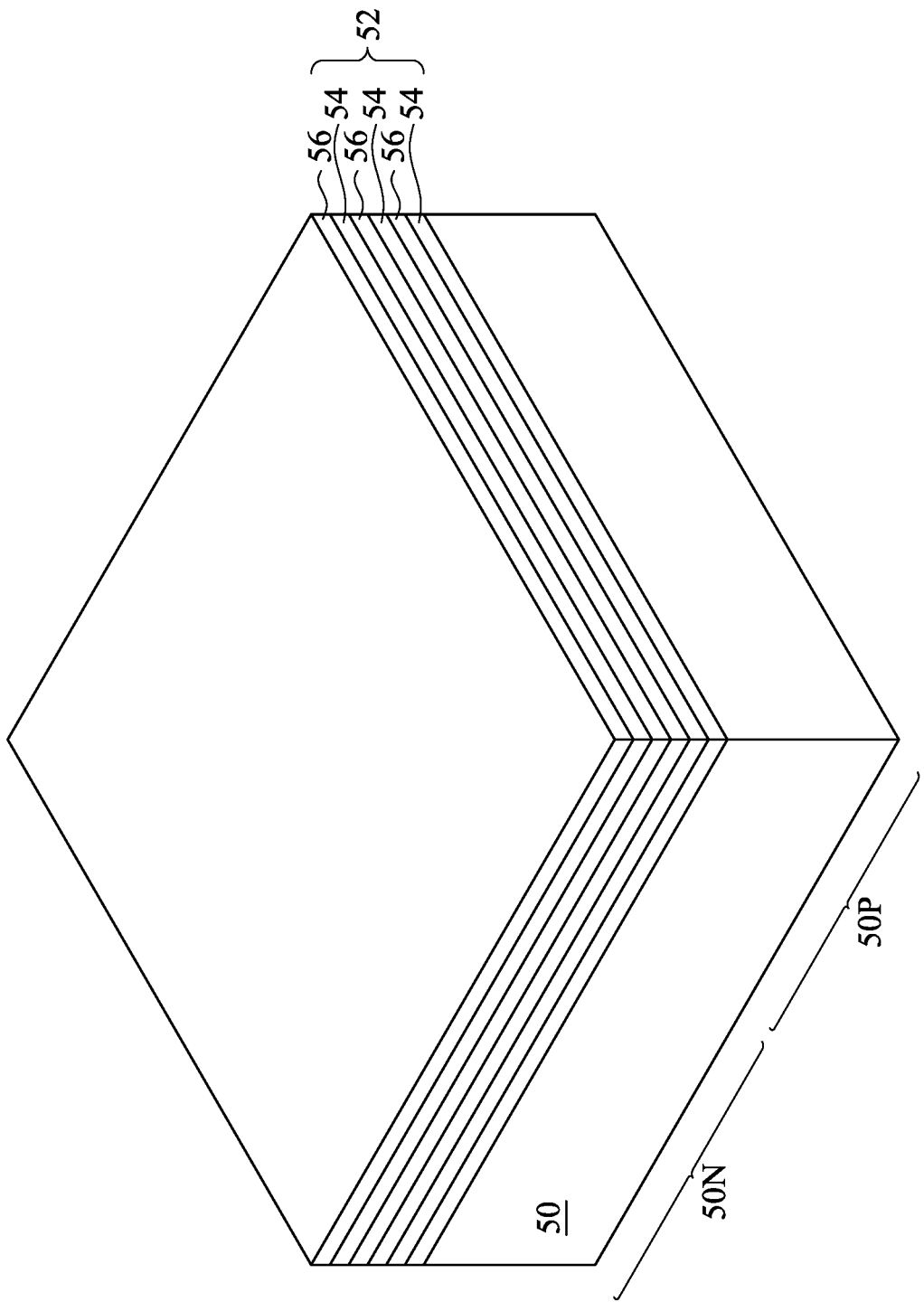
FIGS. 2, 3, and 11 are three-dimensional views of intermediate stages in the manufacturing of nano-FETs, in accordance with some embodiments.
Figure 3:
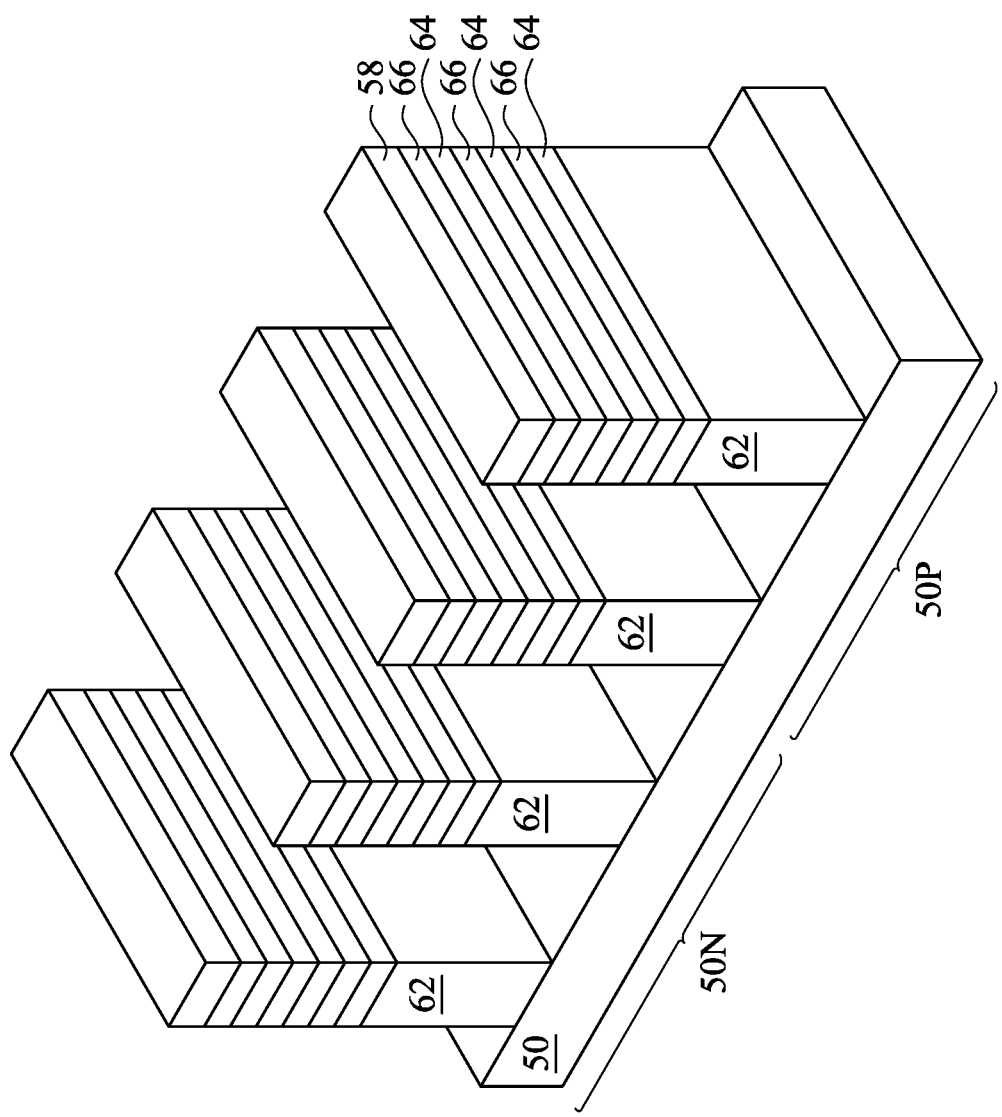

FIGS. 2 through 30C are views of intermediate stages in the manufacturing of nano-FETs, in accordance with some embodiments. FIGS. 2, 3, and 11 are three-dimensional views. FIGS. 14A, 15A, 16A, 17A, 18A, 19A, 20A, 21A, 22A, 23A, 24A, 25A, 26A, 27A, 28A, 29A, and 30A are cross-sectional views illustrated along a similar cross-section as reference cross-section A-A' in FIG. 1. FIGS. 4 through 10, 12, 13, 14B, 15B, 16B, 17B, 18B, 19B, 20B, 21B, 22B, 23B, 24B, 25B, 26B, 27B, 28B, 29B, and 30B are cross-sectional views illustrated along a similar cross-section as reference cross-section B-B' in FIG. 1. FIGS. 14C, 15C, 16C, 17C, 18C, 19C, 20C, 21C, 22C, 23C, 24C, 25C, 26C, 27C, 28C, 29C, and 30C are cross-sectional views illustrated along a similar cross-section as reference cross-section C-C' in FIG. 1.

In FIG. 2, a substrate 50 is provided for forming nano-FETs. The substrate 50 may be a semiconductor substrate, such as a bulk semiconductor, a semiconductor-on-insulator (SOI) substrate, or the like, which may be doped (e.g., with a p-type or an n-type impurity) or undoped. The substrate 50 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (not separately illustrated), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

The substrate 50 may be lightly doped with a p-type or an n-type impurity. An anti-punch-through (APT) implantation may be performed on an upper portion of the substrate 50 to form an APT region. During the APT implantation, impurities may be implanted in the substrate 50. The impurities may have a conductivity type opposite from a conductivity type of source/drain regions that will be subsequently formed in each of the n-type region 50N and the p-type region 50P. The APT region may extend under the source/drain regions in the nano-FETs. The APT region may be used to reduce the leakage from the source/drain regions to the substrate 50. In some embodiments, the doping concentration in the APT region is in the range of $10^{18}$ cm$^{-3}$ to $10^{19}$ cm$^{-3}$.

A multi-layer stack 52 is formed over the substrate 50. The multi-layer stack 52 includes alternating first semiconductor layers 54 and second semiconductor layers 56. The first semiconductor layers 54 are formed of a first semiconductor material, and the second semiconductor layers 56 are formed of a second semiconductor material. The semiconductor materials may each be selected from the candidate semiconductor materials of the substrate 50. In the illustrated embodiment, the multi-layer stack 52 includes three layers of each of the first semiconductor layers 54 and the second semiconductor layers 56. It should be appreciated that the multi-layer stack 52 may include any number of the first semiconductor layers 54 and the second semiconductor layers 56. For example, the multi-layer stack 52 may include from one to ten layers of each of the first semiconductor layers 54 and the second semiconductor layers 56.

In the illustrated embodiment, and as will be subsequently described in greater detail, the first semiconductor layers 54 will be removed and the second semiconductor layers 56 will be patterned to form channel regions for the nano-FETs in both the n-type region 50N and the p-type region 50P. The first semiconductor layers 54 are sacrificial layers (or dummy layers), which will be removed in subsequent processing to expose the top surfaces and the bottom surfaces of the second semiconductor layers 56. The first semiconductor material of the first semiconductor layers 54 is a material that has a high etching selectivity from the etching of the second semiconductor layers 56, such as silicon germanium. The second semiconductor material of the second semiconductor layers 56 is a material suitable for both n-type and p-type devices, such as silicon.

In another embodiment (not separately illustrated), the first semiconductor layers 54 will be patterned to form channel regions for nano-FETs in one region (e.g., the p-type region 50P), and the second semiconductor layers 56 will be patterned to form channel regions for nano-FETs in another region (e.g., the n-type region 50N). The first semiconductor material of the first semiconductor layers 54 may be a material suitable for p-type devices, such as silicon germanium (e.g., $Si_xGe_{1-x}$, where x can be in the range of 0 to 1), pure germanium, a III-V compound semiconductor, a II-VI compound semiconductor, or the like. The second semiconductor material of the second semiconductor layers 56 may be a material suitable for n-type devices, such as silicon, silicon carbide, a III-V compound semiconductor, a II-VI compound semiconductor, or the like. The first semiconductor material and the second semiconductor material may have a high etching selectivity from the etching of one another, so that the first semiconductor layers 54 may be removed without removing the second semiconductor layers 56 in the n-type region 50N, and the second semiconductor layers 56 may be removed without removing the first semiconductor layers 54 in the p-type region 50P. Each of the layers may have a small thickness, such as a thickness in a range of 5 nm to 30 nm.

In FIG. 3, trenches are patterned in the substrate 50 and the multi-layer stack 52 to form semiconductor fins 62, nanostructures 64, and nanostructures 66. The semiconductor fins 62 are semiconductor strips patterned in the substrate 50. The nanostructures 64 and the nanostructures 66 include the remaining portions of the first semiconductor layers 54 and the second semiconductor layers 56, respectively. The trenches may be patterned by any acceptable etch process, such as a reactive ion etch (RIE), neutral beam etch (NBE), the like, or a combination thereof. The etching may be anisotropic.

The semiconductor fins 62 and the nanostructures 64, 66 may be patterned by any suitable method. For example, the semiconductor fins 62 and the nanostructures 64, 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as a mask 58 to pattern the semiconductor fins 62 and the nanostructures 64, 66.

In some embodiments, the semiconductor fins 62 and the nanostructures 64, 66 each have widths in a range of 8 nm to 40 nm. In the illustrated embodiment, the semiconductor fins 62 and the nanostructures 64, 66 have substantially equal widths in the n-type region 50N and the p-type region 50P. In another embodiment, the semiconductor fins 62 and the nanostructures 64, 66 in one region (e.g., the n-type region 50N) are wider or narrower than the semiconductor fins 62 and the nanostructures 64, 66 in another region (e.g., the p-type region 50P). Further, while each of the semiconductor fins 62 and the nanostructures 64, 66 are illustrated as having a consistent width throughout, in other embodiments, the semiconductor fins 62 and/or the nanostructures 64, 66 may have tapered sidewalls such that a width of each of the semiconductor fins 62 and/or the nanostructures 64, 66 continuously increases in a direction towards the substrate 50. In such embodiments, each of the nanostructures 64, 66 may have a different width and be trapezoidal in shape.

In FIGS. 4 through 11, STI regions 72 are formed over the substrate 50 and between adjacent semiconductor fins 62. The steps described with respect to FIGS. 4 through 11 may be applied concurrently to the n-type region 50N as well as the p-type region 50P. The STI regions 72 are disposed around at least a portion of the semiconductor fins 62 such that at least a portion of the nanostructures 64, 66 protrude from between adjacent STI regions 72. In the illustrated embodiment, the top surfaces of the STI regions 72 are below the top surfaces of the semiconductor fins 62. In some embodiments, the top surfaces of the STI regions 72 are above or coplanar (within process variations) with the top surfaces of the semiconductor fins 62.

The STI regions 72 may be formed by any suitable method. For example, an insulation material can be formed over the substrate 50 and the nanostructures 64, 66, and between adjacent semiconductor fins 62. In some embodiments as illustrated in FIG. 4, the insulation material may be silicon oxide (e.g., SiO such as $SiO_2$) formed by flowable chemical vapor deposition (FCVD).

Figure 4:
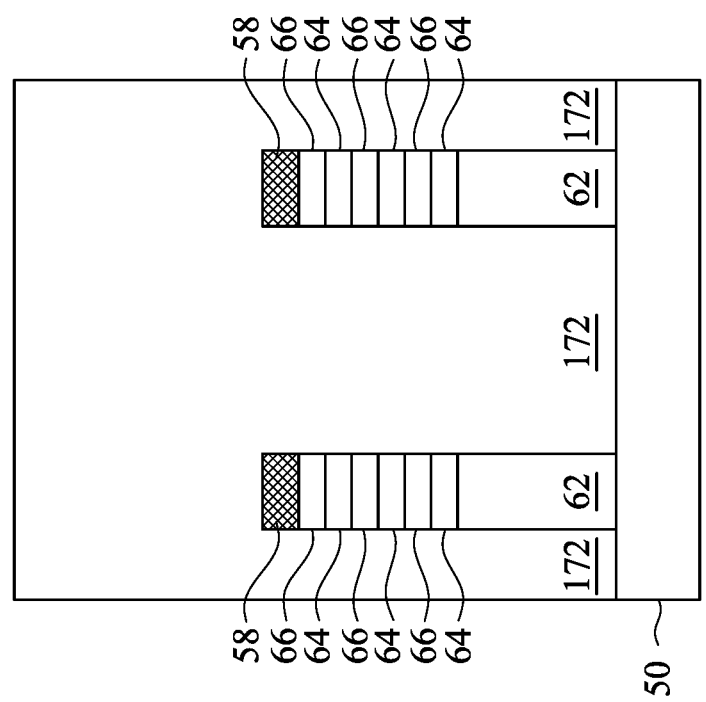

In FIG. 4, a flowable dielectric film 172 may be deposited over the substrate 50, the nanostructures 64, 66, and the mask 58 (if present), and between adjacent semiconductor fins 62. The flowable dielectric film 172 may be initially deposited in a flowable state using a FCVD process, for example. One or more processing chambers may be utilized to deposit the flowable dielectric film 172. The flowable dielectric film 172 may be formed using a high-density plasma CVD system, a plasma enhanced CVD system, and/or a sub-atmospheric CVD system, among other systems. Depositing the flowable dielectric film 172 may include flowing and reacting one or more precursors, including a silicon containing flowable precursor, an ammonia ($NH_3$) precursor, and an oxygen containing flowable precursor. At least the silicon containing flowable precursor and the oxygen containing flowable precursor may be supplied at a sufficiently high temperature (e.g., in the range of 10° C. to 500° C.) to maintain a flowable state of the precursors. The silicon containing flowable precursor may include trisilylamine ($Si_3NH_9$), or the like. The oxygen containing flowable precursor may include oxygen ($O_2$), ozone ($O_3$), the like, or the combinations thereof. After the reaction, the flowable dielectric film 172 may comprise one or more types of molecules that include one or more of silicon, oxygen, hydrogen, and nitrogen atoms.

Figure 5:
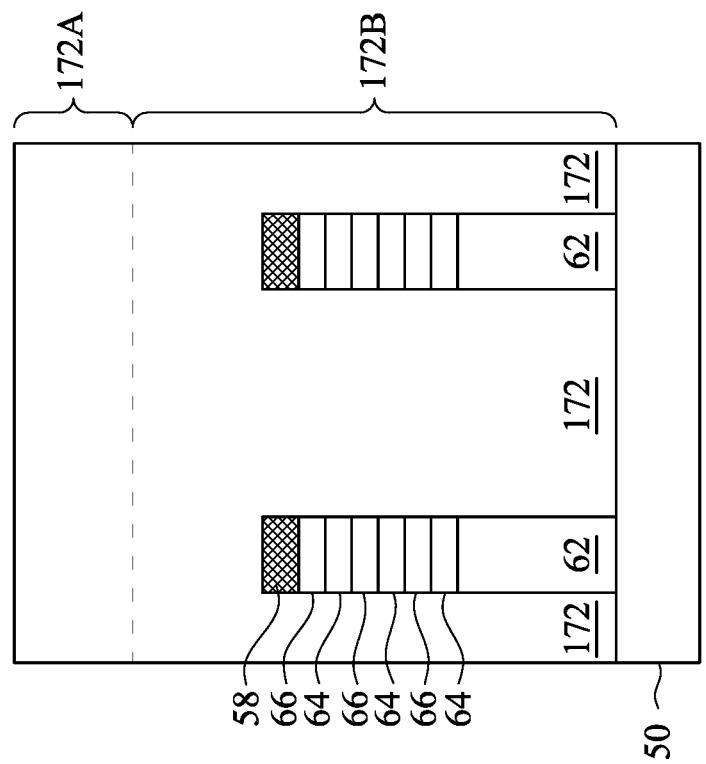

In FIG. 5, an ozone ($O_3$) treatment may be performed on the flowable dielectric film 172 to create an ozone-treated section 172A of the flowable dielectric film 172. The ozone treatment may convert an upper portion of the flowable dielectric film 172 to be more oxide-like and improve the strength/quantity of silicon-to-silicon bonds in the flowable dielectric film 172. In some embodiments, the ozone treatment may allow at least the upper portion of the flowable dielectric film to be transparent. Further, an ultraviolet (UV) treatment may be performed on the flowable dielectric film 172 after the ozone treatment (e.g., through the transparent upper portion) to create a UV-treated section 172B of the flowable dielectric film 172. The UV treatment may further improve the quantity/strength of bonds between silicon and silicon in the flowable dielectric film 172, and the UV treatment may reach a greater depth than the ozone treatment. The strongest UV treatment area may be at the top of the section 172B (close to the section 172A). The UV treatment may create more Si—Si bonds and therefore increase the film quality.

Figure 6:
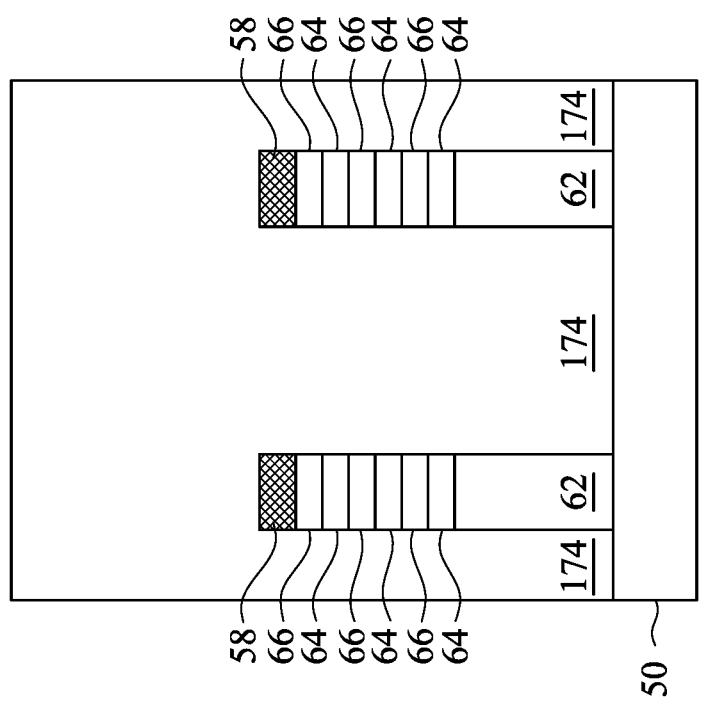

In FIG. 6, the first anneal step may be performed to create a first dielectric film 174 from the flowable dielectric film 172. The first anneal step may be performed by heating the flowable dielectric film 172 in a processing chamber at a relatively low temperature (e.g., at most 500° C.) for a relatively long anneal time (e.g., at least five hours) to remove deep, in-trench nitrogen impurities and reduce the formation of a hard-shell layer during the anneal process. The flowable dielectric film 172 may be exposed to a first gas mixture injected into the processing chamber. The first gas mixture may include a wet steam (e.g., $H_2O$), and the first gas mixture may further include $O_2$, $N_2$, the like, or combinations thereof. The water to carrier gas ratio of the first gas mixture may be between 5% and 100%. The anneal temperature may be a first anneal temperature that is at most 500° C. The flowable dielectric film 172 may be annealed at a pressure between 0.01 atmosphere (ATM) and 25 ATM. The anneal time may be at least 5 hours. The anneal time may be no more than 24 hours for throughput considerations. Furthermore, with the long anneal time (e.g., longer than 24 hours), the hard-shell layer may occur and cause side effects even when the anneal temperature is less than 500° C. Annealing may result in formation of a hard shell in the first dielectric film 174. Heating the flowable dielectric film 172 at the relatively low temperature (e.g., at most 500° C.) for a relatively long time (e.g., at least 5 hours) can minimize the thickness of the hard shell formed in the first anneal step and any subsequent anneal step(s). A thick hard shell can reduce or prevent the nitrogen impurity removal. So, minimizing the thickness of the hard shell by heating at the relatively low temperature for a relatively long time described with respect to the first anneal step is crucial to removing a sufficient quantity of the nitrogen impurities from the flowable dielectric film 172 and improving the film quality of the resulting first dielectric film 174. Consequently, a nitrogen concentration of the first dielectric film 174 may be reduced.

Figure 7:
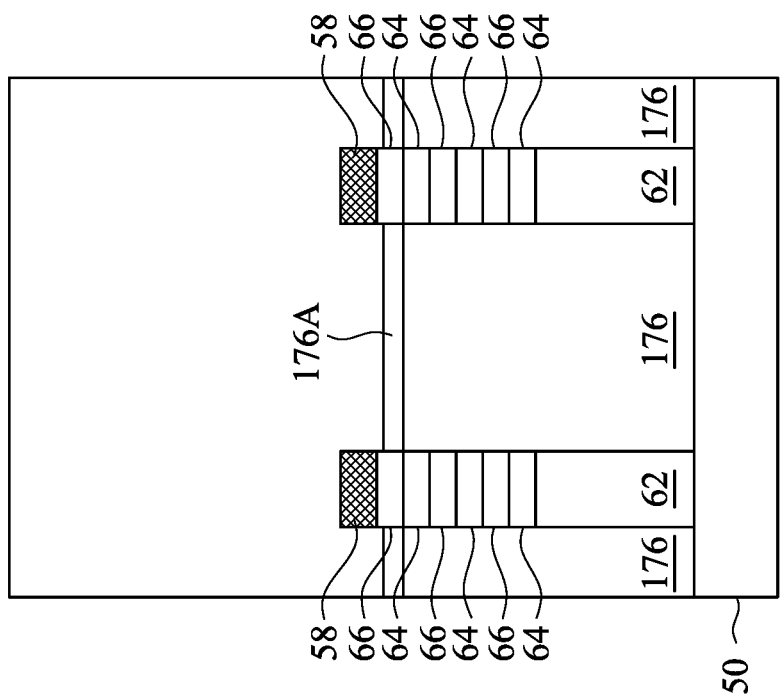

In FIG. 7, an intermediate anneal step may be performed to create a second dielectric film 176 from the first dielectric film 174 to increase the quantity of silicic acid compounds (e.g., Si—OH). The intermediate anneal step may be performed by heating the first dielectric film 174 in a processing chamber at a second anneal temperature higher than the first anneal temperature. The processing chamber for the intermediate anneal step may be the same as or different from the processing chamber for the first anneal step. The first dielectric film 174 may be exposed to a second gas mixture injected into the processing chamber. The second gas mixture may include a wet steam (e.g., $H_2O$), and the second gas mixture may further include $O_2$, $N_2$, $H_2+O_2$, $H_2O_2$, $H_2+O_2$ radical, $O_2$ radical, $H_2O$ radical, the like, or combinations thereof. The second anneal temperature may be at most 700° C. In some embodiments, the second anneal temperature may be between 500° C. and 700° C. The first dielectric film 174 may be exposed to the second gas mixture in an anneal pressure between 0.01 ATM and 25 ATM. After the intermediate anneal step, the second dielectric film 176 may include silicon oxide with a large quantity of silicic acid compounds.

In some embodiments, the intermediate anneal step may include more than one anneal sub-steps to further improve the film quality. Multiple anneal sub-steps may further reduce the nitrogen impurity and minimize a hard-shell layer 176A formed in the second dielectric film 176. The anneal parameters (e.g., composition of the gas mixture, temperature, pressure, etc.) for each of the anneal sub-steps may be the same or different, but are within the ranges described above with respect to the intermediate anneal step.

Figure 8:
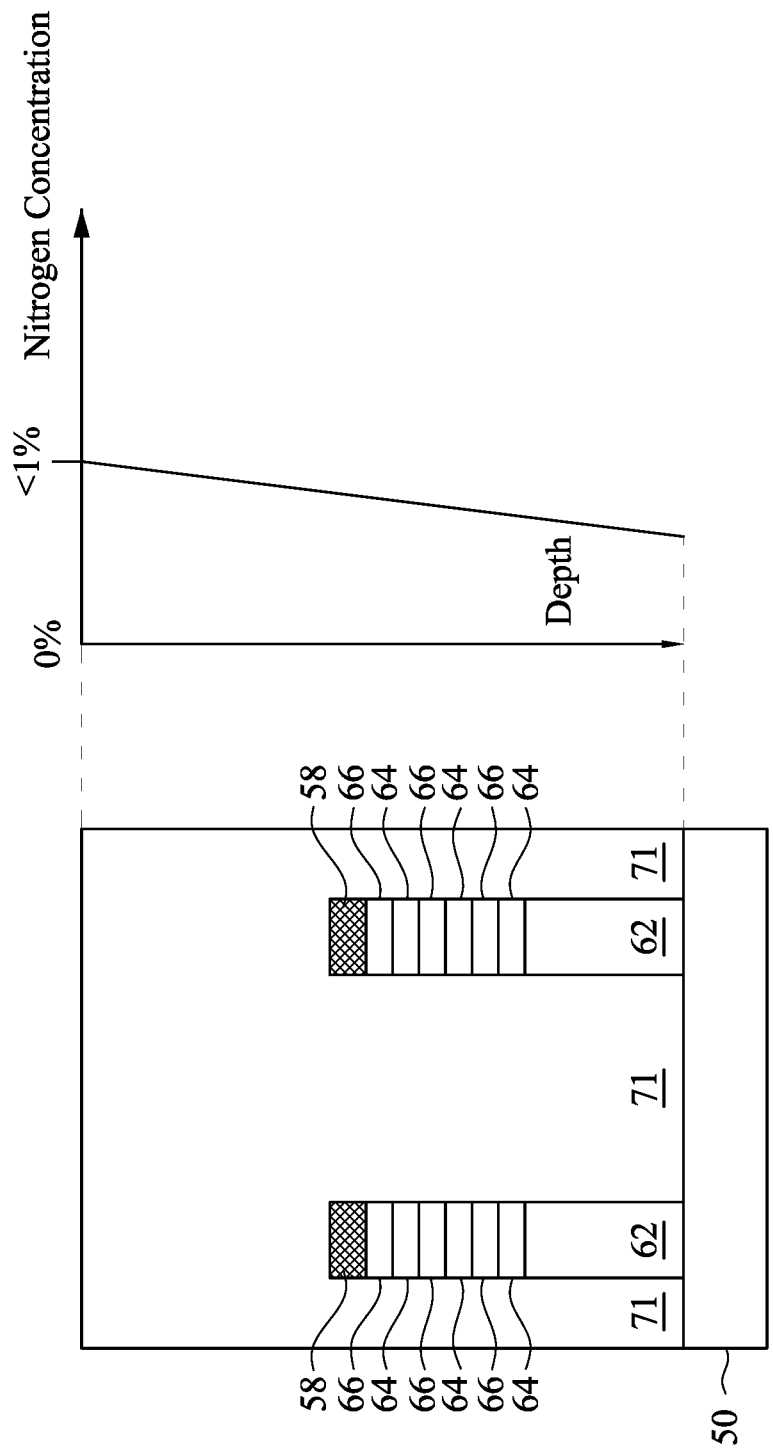

In FIG. 8, a final anneal step may be performed to create the insulating layer 71 from the second dielectric film 176 to improve the oxide quality. The final anneal step may be performed to densify and dehydrate the second dielectric film 176, thereby increasing an oxygen concentration in the insulating layer 71. The final anneal step may be a dry anneal process performed on the second dielectric film 176 at a third anneal temperature higher than the first anneal temperature. The dry anneal process does not need a wet steam in the processing chamber. The third anneal temperature may be at most 800° C. In some embodiments, the third anneal temperature may be also higher than the second anneal temperature. In some additional embodiments, the third anneal temperature may be between 700° C. and 800° C. The different anneal steps (e.g., the first, intermediate, and final anneal steps) may differ in anneal temperatures and/or differ in other ambient anneal parameters (e.g., composition of the gas mixture, pressure, etc.).

After the final anneal step, the insulating layer 71 may include predominantly silicon oxide. The insulating layer 71 may additionally include nitrogen atoms but at a lower concentration than each of the second dielectric film 176, the first dielectric film 174, or the flowable dielectric film 172. The nitrogen concentration (e.g., by atomic percentage) in the insulating layer 71 may be less than 1% throughout. Further, as shown in FIG. 8, the nitrogen concentration in the insulating layer 71 may decrease as the depth of the insulating layer 71 increases (e.g., in the direction from the top edge of the insulating layer 71 to the bottom edge of the insulating layer 71/the underlying substrate 50). In some embodiments, the decrease of the nitrogen concentration in the insulating layer 71 over the depth may be or close to be linear.

Figure 9:
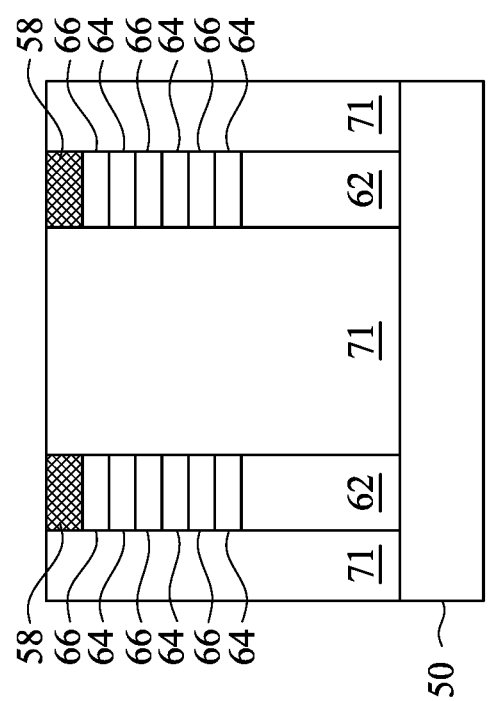

In FIG. 9, a removal process is applied to the insulating layer 71 to remove excess insulation material of the insulating layer 71 over the hard mask 58. In some embodiments, a planarization process such as a chemical mechanical polish (CMP), an etch-back process, combinations thereof, or the like may be utilized. The planarization process exposes the hard mask 58 such that top surfaces of the hard mask 58 and the top surfaces of the insulating layer are level after the planarization process is complete.

The anneal steps described above may be performed after deposition of the flowable dielectric film and/or after the removal process. In other words, the first anneal step, the intermediate anneal step, and the final anneal step described with respect to FIGS. 6-8 may be performed before and/or after the removal process described with respect to FIG. 9 above.

Figure 10:
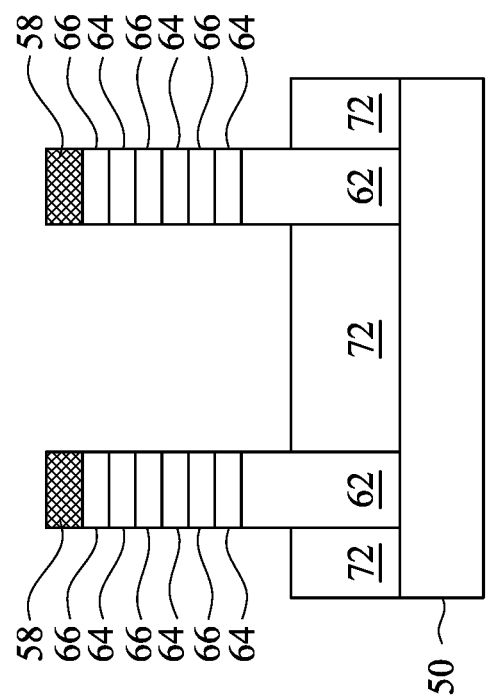
Figure 11:
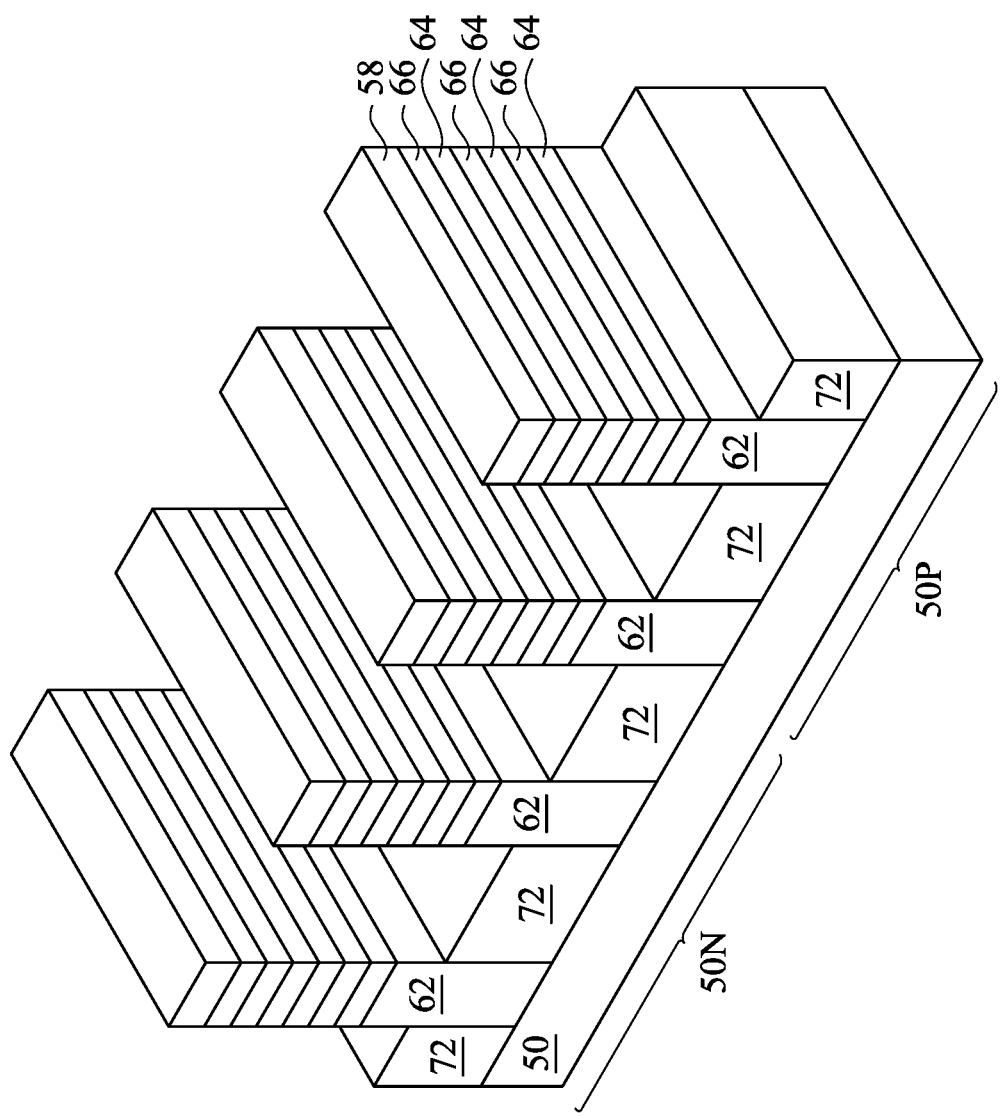

In FIGS. 10 and 11, the insulation layer 71 is recessed to form Shallow Trench Isolation (STI) regions 72. The insulation layer 71 is recessed such that upper portions of semiconductor fins 62 protrude from between neighboring STI regions 72. Further, the top surfaces of the STI regions 72 may have a flat surface as illustrated, a convex surface, a concave surface (such as dishing), or a combination thereof. The top surfaces of the STI regions 72 may be formed flat, convex, and/or concave using an acceptable etching process, such as one that is selective to the material of the insulation layer 71 (e.g., etches the material of the insulation layer 71 at a faster rate than the material of the semiconductor fins 62, the nanostructures 64, 66, and the hard mask 58). For example, an oxide removal using, for example, dilute hydrofluoric (dHF) acid may be used.

The embodiment multi-step anneal process described with respect to FIGS. 6 through 8 can achieve high ratio of FCVD conversion and low nitrogen impurity. The embodiment techniques use multi-step thermal treatment (e.g., a first anneal step utilizing a low anneal temperature and a long anneal time) to covert FCVD to oxide and form a dielectric layer between the fin-fin space in which the nitrogen concentration is lower than 1%. In so doing, the FCVD quality (e.g., in terms of impurity level, density, and etch resistance) is improved. Furthermore, the total thermal budget for process integration is reduced using the embodiment techniques.

Figure 12:
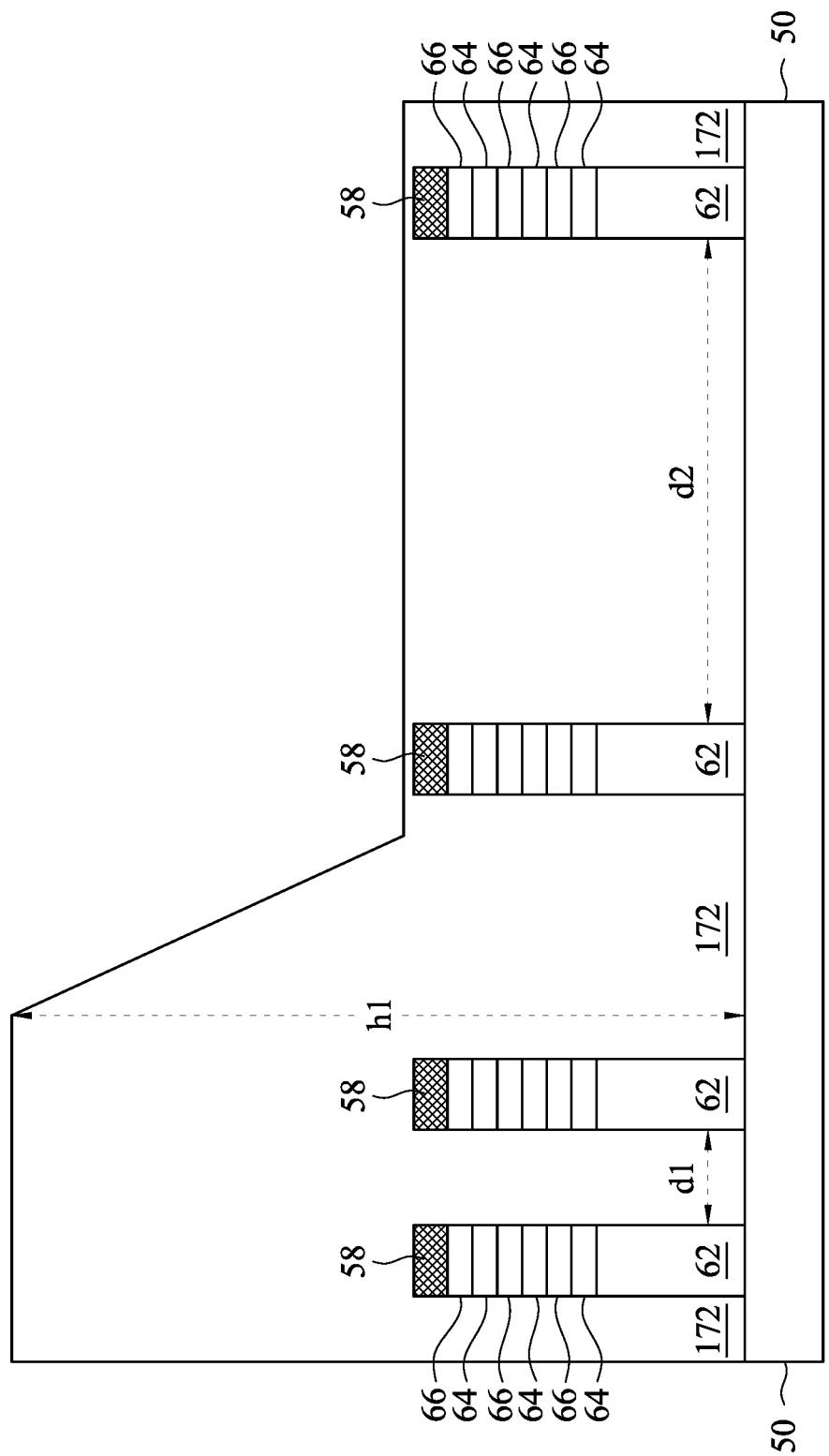
Figure 13:
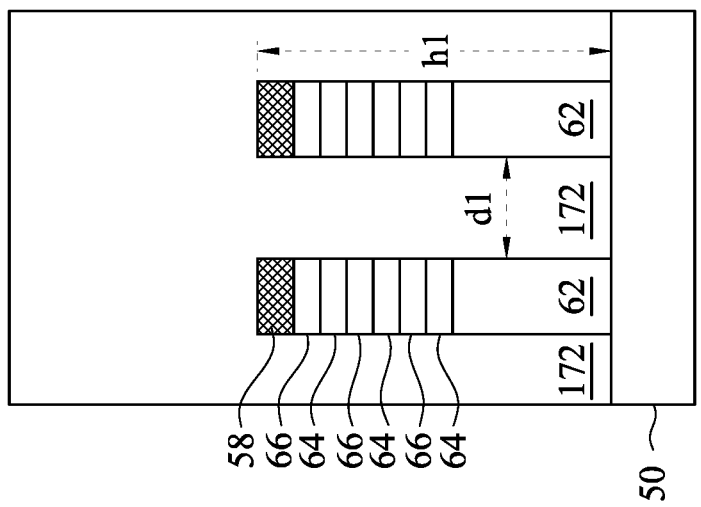

The embodiment multi-step anneal process are beneficial and can be applied to various structural scenarios. FIGS. 12 and 13 show examples of structures to which the embodiment multi-step anneal process may apply. FIGS. 12 and 13 correspond to FIG. 4. FIGS. 12 and 13 show more detailed effects after the flowable dielectric film 172 has been deposited, accounting for differences in the pattern density of structures. For example, FIG. 12 shows a structure where the fin-fin spacing (e.g., pattern density) varies greatly. In some embodiments, the fin-fin spacing may be in a range from 17 nm to 500 nm. For example, the fin-fin spacing d1 and the fin-fin spacing d2 in FIG. 12 may be 17 nm and the 500 nm, respectively. With FCVD, the dielectric material fills the gap faster at the narrower spacing (e.g., d1) part than at the wider spacing (e.g., d2) part of the flowable dielectric film 172. During the FCVD deposition, when the wider spacing part of the flowable dielectric film 172 is just above the top of the mask 58, the narrower spacing part of the flowable dielectric film 172 could be much higher than the wider spacing part of the flowable dielectric film 172 due to the faster FCVD deposition speed at the narrower part. For example, the height h1 in FIG. 12 may be between 100 nm and 600 nm depending on the pattern density and the in-trench depth. The narrower part of flowable dielectric film 172 being high may present technical problems of low conversion at the in-trench bottom because a possible hard shell may mitigate the nitrogen impurity removal. The embodiment multi-step anneal process solve these technical problems and improve the oxide quality. In some embodiments, when the pattern density (e.g., in the fin area or in the spacing area) is in a range from 5% to 95%, the embodiment multi-step anneal process may be utilized to improve the oxide quality of the STI regions 72.

In another example, FIG. 13 shows a structure that, even if the fin-fin spacing range may be small, the height of the trench is deep (e.g., between 30 nm and 400 nm), or the aspect ratio of the trench is high (e.g., between 2 to 40). The aspect ratio (h/d) may be represented as the height (h) of a semiconductor fin 62, the nanostructures 64, 66 above the semiconductor fin 62, and the hard mask 58 (if present) over a distance between two adjacent semiconductor fins 62 (d). In some embodiments, the height of the trench may be the height of the semiconductor fin 62. The aspect ratio may be represented as the height of a semiconductor fin 62 over the distance between two adjacent semiconductor fins 62 (d). The deep trench or the high aspect ratio of the trench may also present technical problems of low conversion at the in-trench bottom. The embodiment multi-step anneal process solve these technical problems and improve the oxide quality.

FIGS. 4 through 11 illustrate embodiments of forming STI regions 72 using FCVD. Alternatively, other embodiments without using FCVD may be utilized to form the STI regions 72 shown in FIGS. 10 and 11. For example, the insulation material may be an oxide, such as silicon oxide, a nitride, such as silicon nitride, the like, or a combination thereof, which may be formed by a chemical vapor deposition (CVD) process, such as high density plasma CVD (HDP-CVD), the like, or a combination thereof. Other insulation materials formed by any acceptable process may be used. An anneal process may be performed once the insulation material is formed. In an embodiment, the insulation material is formed such that excess insulation material covers the nanostructures 64, 66. Although the STI regions 72 are each illustrated as a single layer, some embodiments may utilize multiple layers. For example, in some embodiments a liner (not separately illustrated) may first be formed along surfaces of the substrate 50, the semiconductor fins 62, and the nanostructures 64, 66. Thereafter, an insulation material, such as those previously described may be formed over the liner.

A removal process is then applied to the insulation material to remove excess insulation material over the nanostructures 64, 66. In some embodiments, a planarization process such as a chemical mechanical polish (CMP), an etch-back process, combinations thereof, or the like may be utilized. In some embodiments, the planarization process may expose the mask 58 or remove the mask 58. After the planarization process, the top surfaces of the insulation material and the mask 58 or the nanostructures 64, 66 are coplanar (within process variations). Accordingly, the top surfaces of the mask 58 (if present) or the nanostructures 64, 66 are exposed through the insulation material. In the illustrated embodiment, the mask 58 remains on the nanostructures 64, 66. The insulation material is then recessed to form the STI regions 72. The insulation material is recessed such that at least a portion of the nanostructures 64, 66 protrude from between adjacent portions of the insulation material. Further, the top surfaces of the STI regions 72 may have a flat surface as illustrated, a convex surface, a concave surface (such as dishing), or a combination thereof by applying an appropriate etch. The insulation material may be recessed using any acceptable etching process, such as one that is selective to the material of the insulation material (e.g., selectively etches the insulation material of the STI regions 72 at a faster rate than the materials of the semiconductor fins 62 and the nanostructures 64, 66). For example, an oxide removal may be performed using dilute hydrofluoric (dHF) acid as an etchant.

The process previously described is just one example of how the semiconductor fins 62 and the nanostructures 64, 66 may be formed. In some embodiments, the semiconductor fins 62 and/or the nanostructures 64, 66 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the semiconductor fins 62 and/or the nanostructures 64, 66. The epitaxial structures may include the alternating semiconductor materials previously described, such as the first semiconductor material and the second semiconductor material. In some embodiments where epitaxial structures are epitaxially grown, the epitaxially grown materials may be in situ doped during growth, which may obviate prior and/or subsequent implantations, although in situ and implantation doping may be used together.

Further, appropriate wells (not separately illustrated) may be formed in the nanostructures 64, 66, the semiconductor fins 62, and/or the substrate 50. The wells may have a conductivity type opposite from a conductivity type of source/drain regions that will be subsequently formed in each of the n-type region 50N and the p-type region 50P. In some embodiments, a p-type well is formed in the n-type region 50N, and an n-type well is formed in the p-type region 50P. In some embodiments, a p-type well or an n-type well is formed in both the n-type region 50N and the p-type region 50P.

In embodiments with different well types, different implant steps for the n-type region 50N and the p-type region 50P may be achieved using mask (not separately illustrated) such as a photoresist. For example, a photoresist may be formed over the semiconductor fins 62, the nanostructures 64, 66, and the STI regions 72 in the n-type region 50N. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in the range of $10^{13}$ cm$^{-3}$ to $10^{14}$ cm$^{-3}$. After the implant, the photoresist may be removed, such as by any acceptable ashing process.

Following or prior to the implanting of the p-type region 50P, a mask (not separately illustrated) such as a photoresist is formed over the semiconductor fins 62, the nanostructures 64, 66, and the STI regions 72 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in the range of $10^{13}$ cm$^{-3}$ to $10^{14}$ cm$^{-3}$. After the implant, the photoresist may be removed, such as by any acceptable ashing process.

After the implants of the n-type region 50N and the p-type region 50P, an anneal may be performed to repair implant damage and to activate the p-type and/or n-type impurities that were implanted. In some embodiments where epitaxial structures are epitaxially grown for the semiconductor fins 62 and/or the nanostructures 64, 66, the grown materials may be in situ doped during growth, which may obviate the implantations, although in situ and implantation doping may be used together.

Continuing from FIGS. 10 and 11, FIGS. 14A-30C illustrate various additional steps in the manufacturing of embodiment devices. FIGS. 14A-30C illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are described in the text accompanying each figure. As will be subsequently described in greater detail, insulating fins 82 will be formed between the semiconductor fins 62. FIGS. 14A, 15A, 16A, 17A, 18A, 19A, 20A, 21A 22A, 23A, 24A, 25A, 26A, 27A, 28A, 29A, and 30A illustrate a semiconductor fin 62 and structures formed on it. FIGS. 14B, 14C, 15B, 15C, 16B, 16C, 17B, 17C, 18B, 18C, 19B, 19C, 20B, 20C, 21B, 21C, 22B, 22C, 23B, 23C, 24B, 24C, 25B, 25C, 26B, 26C, 27B, 27C, 28B, 28C, 29B, 29C, 30B, and 30C each illustrate two semiconductor fins 62 and portions of the insulating fins 82 and the STI regions 72 that are disposed between the two semiconductor fins 62 in the respective cross-sections.

Figure 14A:
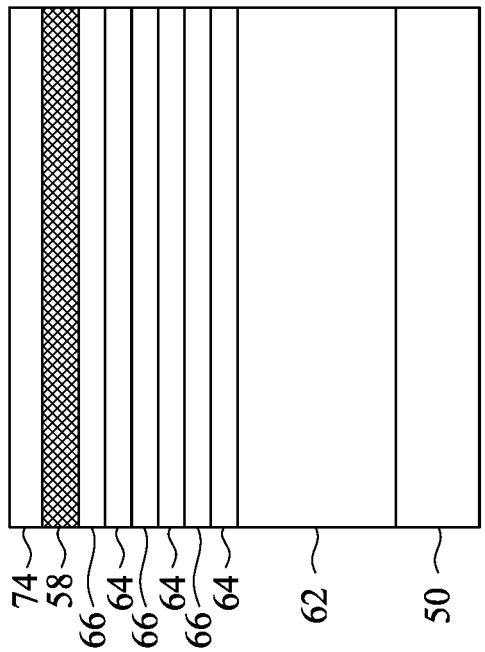
Figure 14C:
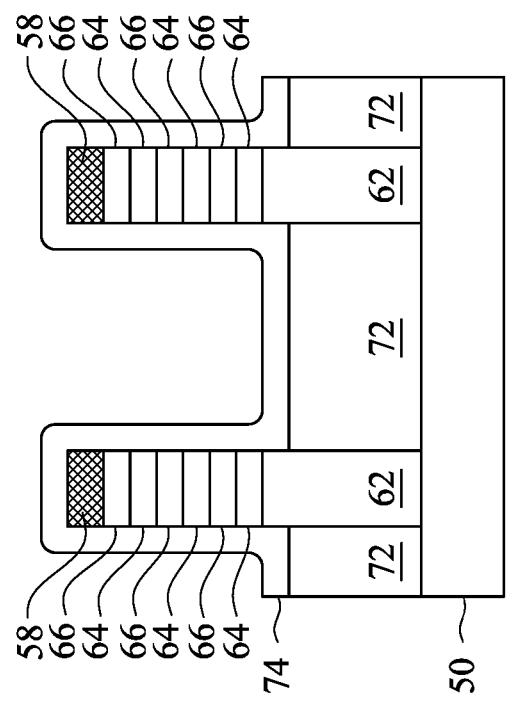
Figure 14B:
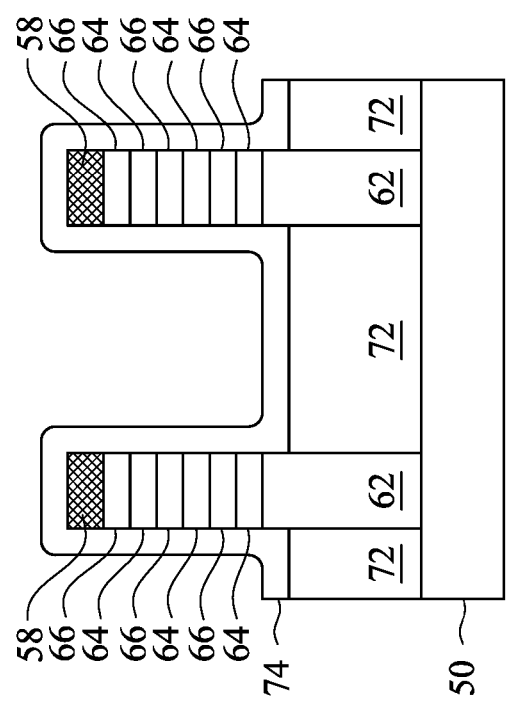

In FIGS. 14A-C, a sacrificial layer 74 is conformally formed over the mask 58, the semiconductor fins 62, the nanostructures 64, 66, and the STI regions 72. The sacrificial layer 74 may be formed of a semiconductor material (such as one selected from the candidate semiconductor materials of the substrate 50), which may be grown by a process such as vapor phase epitaxy (VPE) or molecular beam epitaxy (MBE), deposited by a process such as chemical vapor deposition (CVD) or atomic layer deposition (ALD), or the like. For example, the sacrificial layer 74 may be formed of silicon or silicon germanium.

In FIGS. 15A-C, the sacrificial layer 74 is patterned to form sacrificial spacers 76 using an etching process, such as a dry etch, a wet etch, or a combination thereof. The etching process may be anisotropic. As a result of the etching process, the portions of the sacrificial layer 74 over the mask 58 and the nanostructures 64, 66 are removed, and the STI regions 72 between the nanostructures 64, 66 are partially exposed. The sacrificial spacers 76 are disposed over the STI regions 72 and are further disposed on the sidewalls of the mask 58, the semiconductor fins 62, and the nanostructures 64, 66.

In subsequent process steps, a dummy gate layer 84 may be deposited over portions of the sacrificial spacers 76 (see below, FIGS. 20A-C), and the dummy gate layer 84 may be patterned to provide dummy gates 94 that include underlying portions of the sacrificial spacers 76 (see below, FIGS. 21A-C). These dummy gates 94 (e.g., patterned portions of the dummy gate layer 84 and portions of the sacrificial spacers 76) may then be replaced with a functional gate stack. Specifically, the sacrificial spacers 76 are used as temporary spacers during processing to delineate boundaries of insulating fins, and the sacrificial spacers 76 and the nanostructures 64 will be subsequently removed and replaced with gate structures that are wrapped around the nanostructures 66. The sacrificial spacers 76 are formed of a material that has a high etching selectivity from the etching of the material of the nanostructures 66. For example, the sacrificial spacers 76 may be formed of the same semiconductor material as the nanostructures 64 so that the sacrificial spacers 76 and the nanostructures 64 may be removed in a single process step. Alternatively, the sacrificial spacers 76 may be formed of a different material as the nanostructures 64.

FIGS. 16A through 18C illustrate a formation of insulating fins 82 (also referred to as hybrid fins or dielectric fins) between the sacrificial spacers 76 adjacent to the semiconductor fins 62 and nanostructures 64, 66. The insulating fins 82 may insulate and physically separate subsequently formed source/drain regions (see below, FIGS. 23A-C) from each other.

Figure 16A:
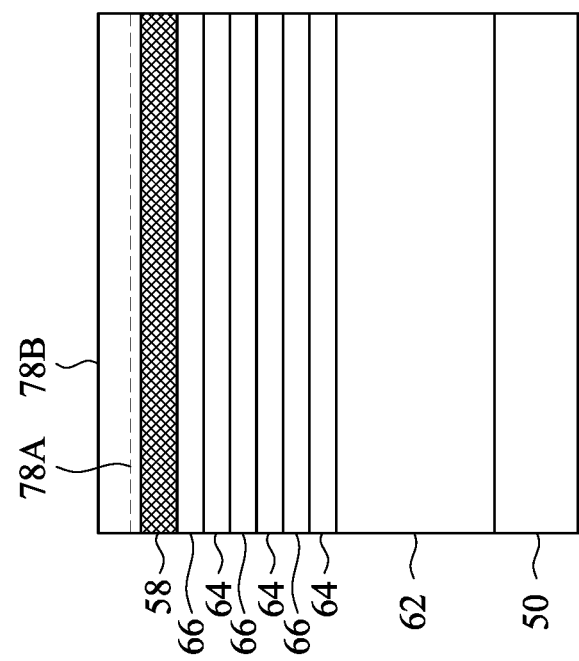
Figure 16C:
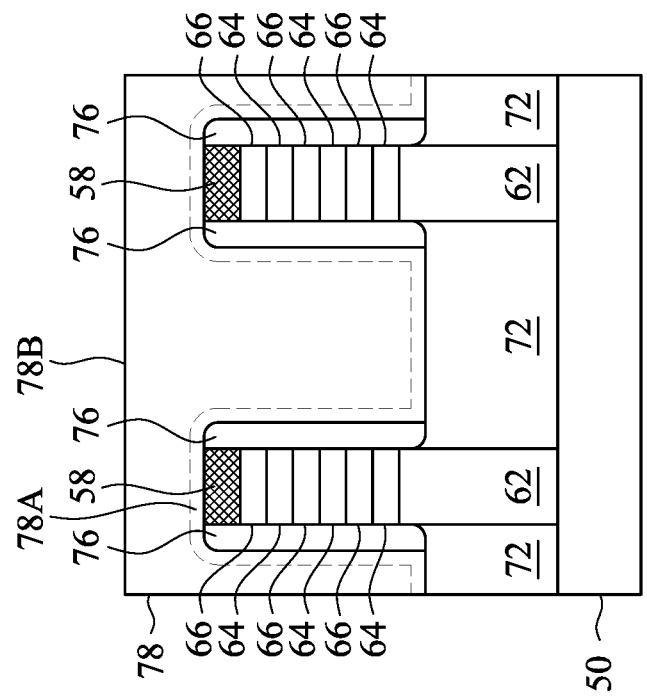
Figure 16B:
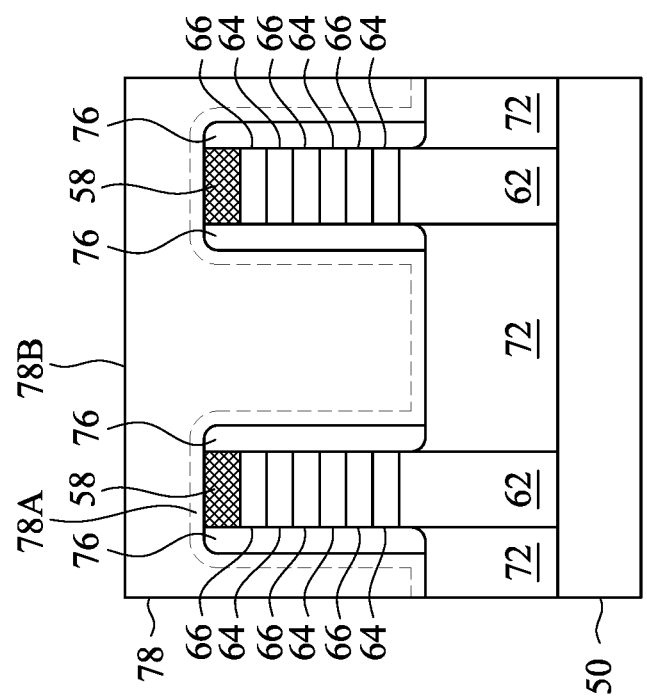

In FIGS. 16A-C, a liner 78A and a fill material 78B are formed over the structure. The liner 78A is conformally deposited over exposed surfaces of the STI regions 72, the masks 58, the semiconductor fins 62, the nanostructures 64, 66, and the sacrificial spacers 76 by an acceptable deposition process such as atomic layer deposition (ALD), chemical vapor deposition (CVD), physical vapor deposition (PVD), or the like. The liner 78A may be formed of one or more dielectric material(s) having a high etching selectivity from the etching of the semiconductor fins 62, the nanostructures 64, 66, and the sacrificial spacers 76, e.g. a nitride such as silicon nitride, silicon carbonitride, silicon oxycarbonitride, or the like. The liner 78A may reduce oxidation of the sacrificial spacers 76 during the subsequent formation of the fill material 78B, which may be useful for a subsequent removal of the sacrificial spacers 76.

Next, a fill material 78B is formed over the liner 78A, filling the remaining area between the semiconductor fins 62 and the nanostructures 64, 66 that is not filled by the sacrificial spacers 76 or the liner 78A. The fill material 78B may form the bulk of the lower portions of the insulating fins 82 (see FIGS. 18A-C) to insulate subsequently formed source/drain regions (see FIG. 23C) from each other. The fill material 78B may be formed by an acceptable deposition process such as ALD, CVD, PVD, or the like. The fill material 78B may be formed of one or more dielectric material(s) having a high etching selectivity from the etching of the semiconductor fins 62, the nanostructures 64, 66, the sacrificial spacers 76, and the liner 78A such as an oxide such as silicon oxide, silicon oxynitride, silicon oxycarbonitride, silicon oxycarbide, the like, or combinations thereof.

In FIGS. 17A-C, upper portions of the liner 78A and the fill material 78B above top surfaces of the masks 58 may be removed using one or more acceptable planarization and/or etching processes. The etching process may be selective to the liner 78A and to the fill material 78B (e.g., selectively etches the liner 78A and the fill material 78B at a faster rate than the sacrificial spacers 76 and/or the mask 58). After etching, top surfaces of the liner 78A and the fill material 78B may be below top surfaces of the mask 58. In other embodiments, the fill material 78B may be recessed below top surfaces of the mask 58 while the liner 78A is maintained at a same level as the mask 58.

FIGS. 18A-C illustrate the forming of a dielectric capping layer 80 on the liner 78A and the fill material 78B, thereby forming the insulating fins 82. The dielectric capping layer 80 may fill a remaining area over the liner 78A, over the fill material 78B, and between sidewalls of the mask 58. The dielectric capping layer 80 may be formed by an acceptable deposition process such as ALD, CVD, PVD, or the like. The dielectric capping layer 80 may be formed of one or more dielectric material(s) having a high etching selectivity from the etching of the semiconductor fins 62, the nanostructures 64, 66, the sacrificial spacers 76, the liner 78A, and the fill material 78B. For example, the dielectric capping layer 80 may comprise a high-k material such as hafnium oxide, zirconium oxide, zirconium aluminum oxide, hafnium aluminum oxide, hafnium silicon oxide, aluminum oxide, the like, or combinations thereof.

The dielectric capping layer 80 may be formed to initially cover the mask 58 and the nanostructures 64, 66. Subsequently, a removal process is applied to remove excess material(s) of the dielectric capping layer 80. In some embodiments, a planarization process such as a CMP, an etch-back process, combinations thereof, or the like may be utilized. The planarization process exposes the masks 58 such that top surfaces of the masks 58, the sacrificial spacers 76, and the dielectric capping layer 80 are coplanar (within process variations). In the illustrated embodiment, the masks 58 remain after the planarization process. In another embodiment, portions of or the entirety of the masks 58 may also be removed by the planarization process.

As a result, insulating fins 82 are formed between and contacting the sacrificial spacers 76. The insulating fins 82 comprise the liner 78A, the fill material 78B, and the dielectric capping layer 80. The sacrificial spacers 76 space the insulating fins 82 apart from the nanostructures 64, 66, and a size of the insulating fins 82 may be adjusted by adjusting a thickness of the sacrificial spacers 76.

Figure 19A:
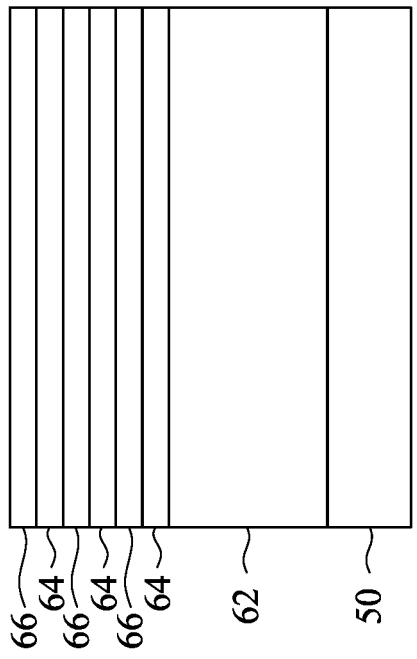
Figure 19C:
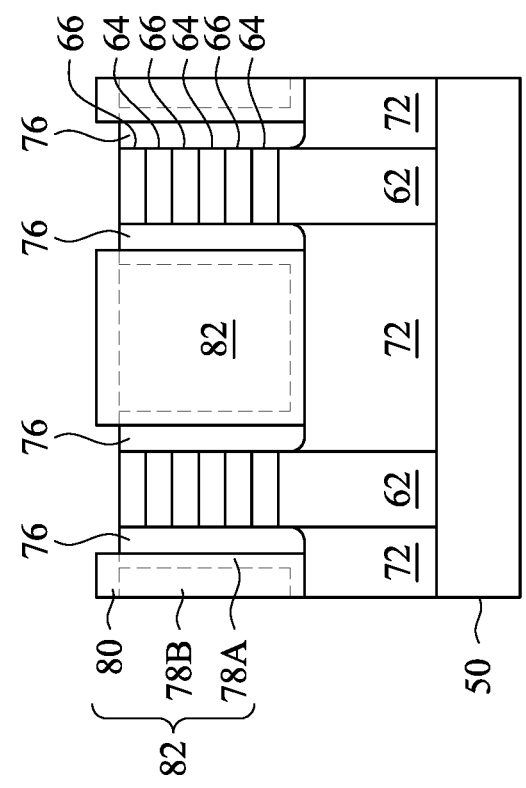
Figure 19B:
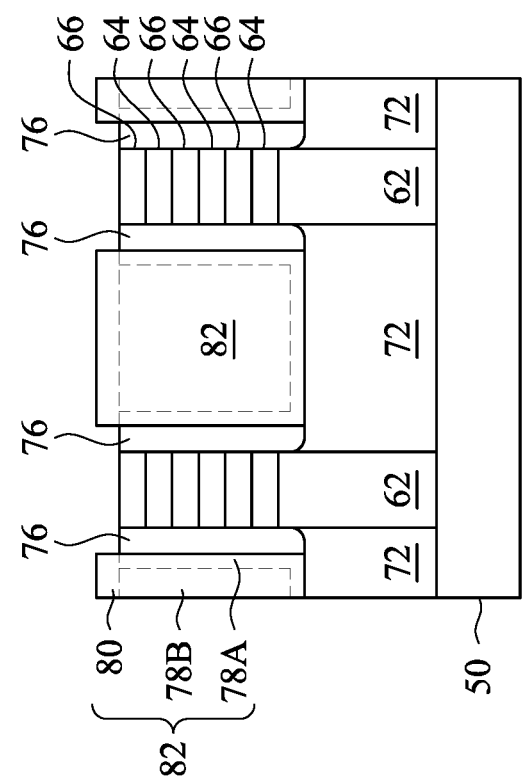

In FIGS. 19A-C, the mask 58 is removed using an etching process, for example. The etching process may be a wet etch that selective removes the mask 58 without significantly etching the insulating fins 82. The etching process may be anisotropic. Further, the etching process (or a separate, selective etching process) may also be applied to reduce a height of the sacrificial spacers 76 to a similar level (e.g., same within processing variations) as the stacked nanostructures 64, 66. After the etching process(es), a topmost surface of the stacked nanostructures 64, 66 and the sacrificial spacers 76 may be exposed and may be lower than a topmost surface of the insulating fins 82.

Figure 20A:
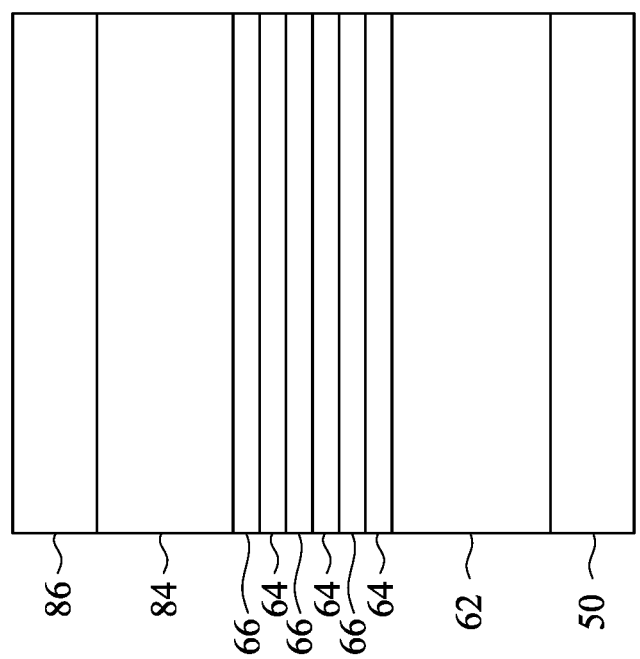
Figure 20C:
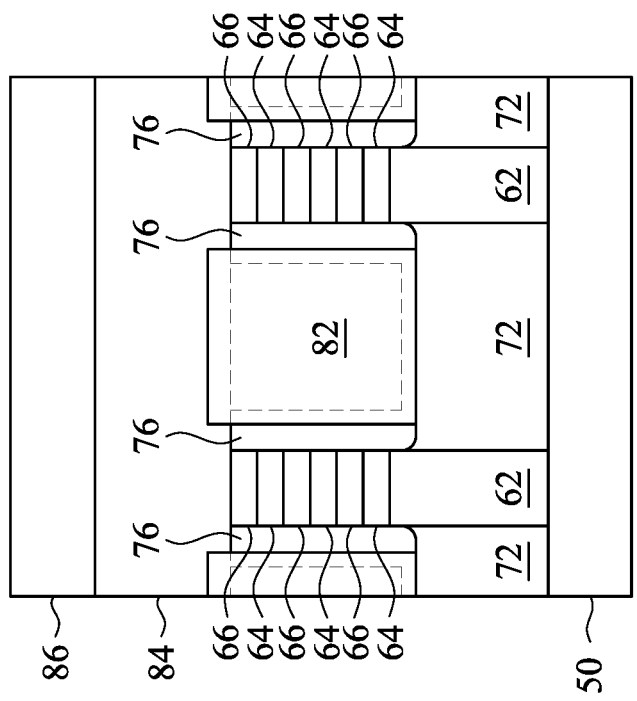
Figure 20B:
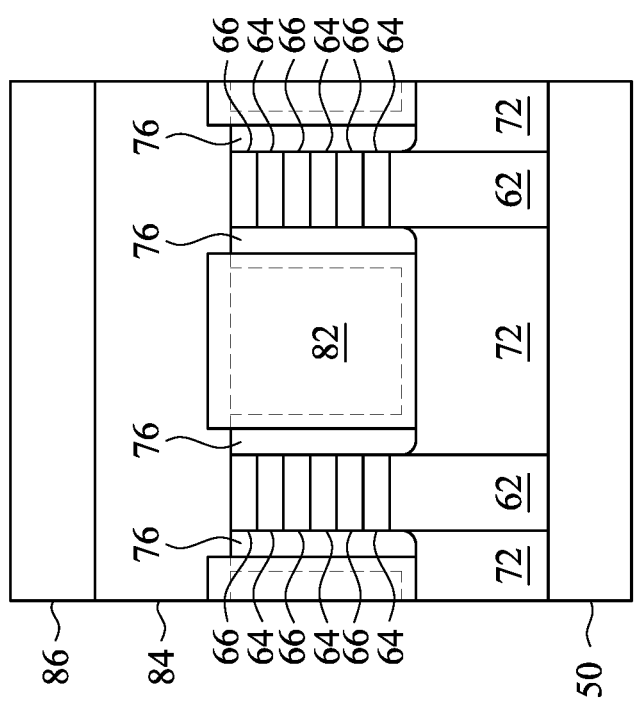

In FIG. 20A-C, a dummy gate layer 84 is formed on the insulating fins 82, the sacrificial spacers 76, and the nanostructures 64, 66. Because the nanostructures 64, 66 and the sacrificial spacers 76 extend lower than the insulating fins 82, the dummy gate layer 84 may be disposed along exposed sidewalls of the insulating fins 82. The dummy gate layer 84 may be deposited and then planarized, such as by a CMP. The dummy gate layer 84 may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The dummy gate layer 84 may also be formed of a semiconductor material (such as one selected from the candidate semiconductor materials of the substrate 50), which may be grown by a process such as vapor phase epitaxy (VPE) or molecular beam epitaxy (MBE), deposited by a process such as chemical vapor deposition (CVD) or atomic layer deposition (ALD), or the like. The dummy gate layer 84 may be formed of material(s) that have a high etching selectivity from the etching of insulation materials, e.g., the insulating fins 82. A mask layer 86 may be deposited over the dummy gate layer 84. The mask layer 86 may be formed of a dielectric material such as silicon nitride, silicon oxynitride, or the like. In this example, a single dummy gate layer 84 and a single mask layer 86 are formed across the n-type region 50N and the p-type region 50P.

Figure 21A:
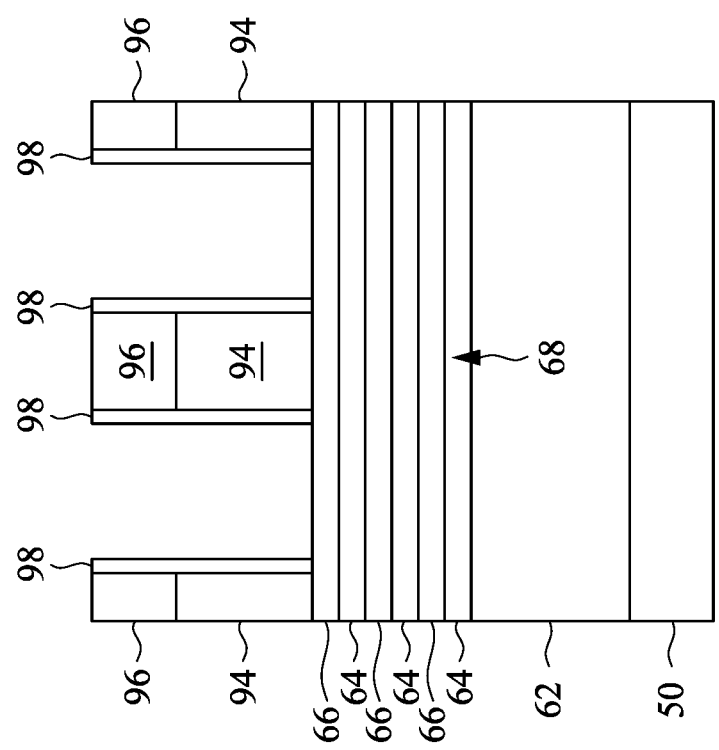
Figure 21C:
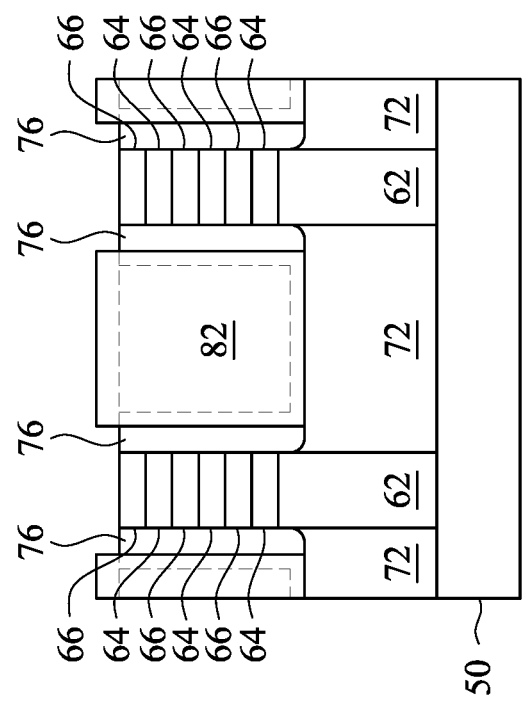
Figure 21B:
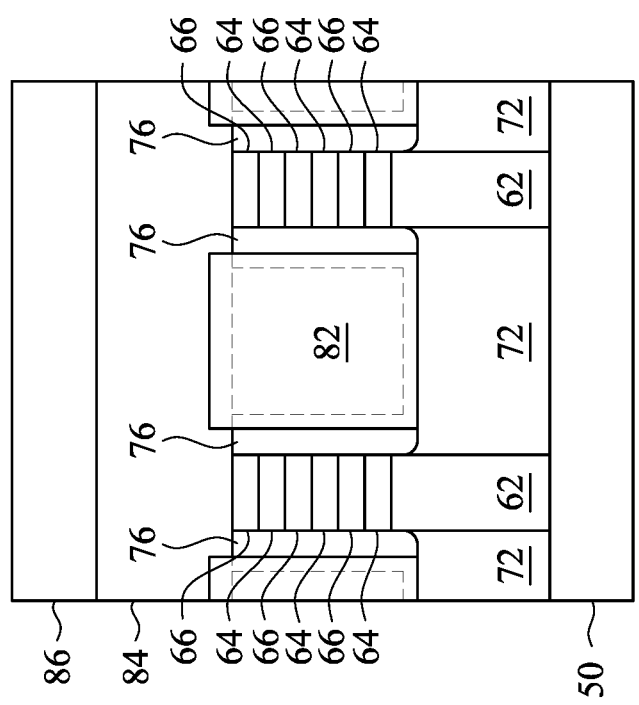

In FIGS. 21A-C, the mask layer 86 is patterned using acceptable photolithography and etching techniques to form masks 96. The pattern of the masks 96 is then transferred to the dummy gate layer 84 by any acceptable etching technique to form dummy gates 94. The dummy gates 94 cover the top surface of the nanostructures 64, 66 that will be exposed in subsequent processing to form channel regions. The pattern of the masks 96 may be used to physically separate adjacent dummy gates 94. The dummy gates 94 may also have lengthwise directions substantially perpendicular (within process variations) to the lengthwise directions of the semiconductor fins 62. The masks 96 can optionally be removed after patterning, such as by any acceptable etching technique.

The sacrificial spacers 76 and the dummy gates 94 collectively extend along the portions of the nanostructures 66 that will be patterned to form channel regions 68. Subsequently formed gate structures will replace the sacrificial spacers 76 and the dummy gates 94. Forming the dummy gates 94 over the sacrificial spacers 76 allows the subsequently formed gate structures to have a greater height.

As noted above, the dummy gates 94 may be formed of a semiconductor material. In such embodiments, the nanostructures 64, the sacrificial spacers 76, and the dummy gates 94 are each formed of semiconductor materials. In some embodiments, the nanostructures 64 and the sacrificial spacers 76 are formed of a first semiconductor material (e.g., silicon germanium) and the dummy gates 94 are formed of a second semiconductor material (e.g., silicon), so that during a replacement gate process, the dummy gates 94 may be removed in a first etching step, and the nanostructures 64 and the sacrificial spacers 76 may be removed together in a second etching step. When the nanostructures 64 and the sacrificial spacers 76 are formed of silicon germanium: the nanostructures 64 and the sacrificial spacers 76 may have similar germanium concentrations, the nanostructures 64 may have a greater germanium concentration than the sacrificial spacers 76, or the sacrificial spacers 76 may have a greater germanium concentration than the nanostructures 64. In some embodiments, the nanostructures 64 are formed of a first semiconductor material (e.g., silicon germanium) and the sacrificial spacers 76 and the dummy gates 94 are formed of a second semiconductor material (e.g., silicon), so that during a replacement gate process, the sacrificial spacers 76 and the dummy gates 94 may be removed together in a first etching step, and the nanostructures 64 may be removed in a second etching step.

Gate spacers 98 are formed over the nanostructures 64, 66, and on exposed sidewalls of the masks 96 (if present) and the dummy gates 94. The gate spacers 98 may be formed by conformally depositing one or more dielectric material(s) on the dummy gates 94 and subsequently etching the dielectric material(s). Acceptable dielectric materials may include silicon oxide, silicon nitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 94 (thus forming the gate spacers 98). After etching, the gate spacers 98 can have curved sidewalls or can have straight sidewalls.

Further, implants may be performed to form lightly doped source/drain (LDD) regions (not separately illustrated). In the embodiments with different device types, similar to the implants for the wells previously described, a mask (not separately illustrated) such as a photoresist may be formed over the n-type region 50N, while exposing the p-type region 50P, and appropriate type (e.g., p-type) impurities may be implanted into the semiconductor fins 62 and/or the nanostructures 64, 66 exposed in the p-type region 50P. The mask may then be removed. Subsequently, a mask (not separately illustrated) such as a photoresist may be formed over the p-type region 50P while exposing the n-type region 50N, and appropriate type impurities (e.g., n-type) may be implanted into the semiconductor fins 62 and/or the nanostructures 64, 66 exposed in the n-type region 50N. The mask may then be removed. The n-type impurities may be any of the n-type impurities previously described, and the p-type impurities may be any of the p-type impurities previously described. During the implanting, the channel regions 68 remain covered by the dummy gates 94, so that the channel regions 68 remain substantially free of the impurity implanted to form the LDD regions. The LDD regions may have a concentration of impurities in the range of $10^{15}$ cm$^{-3}$ to $10^{19}$ cm$^{-3}$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Figure 22A:
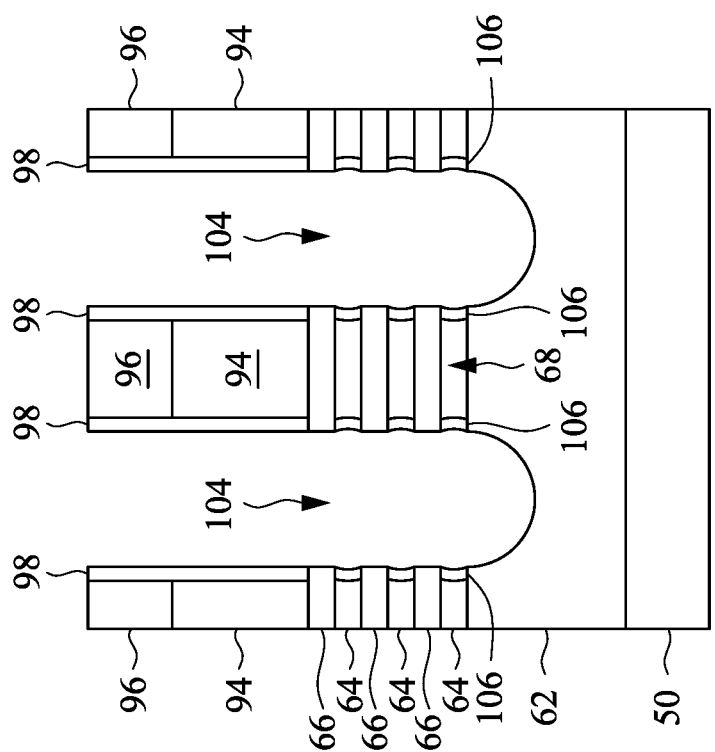
Figure 22C:
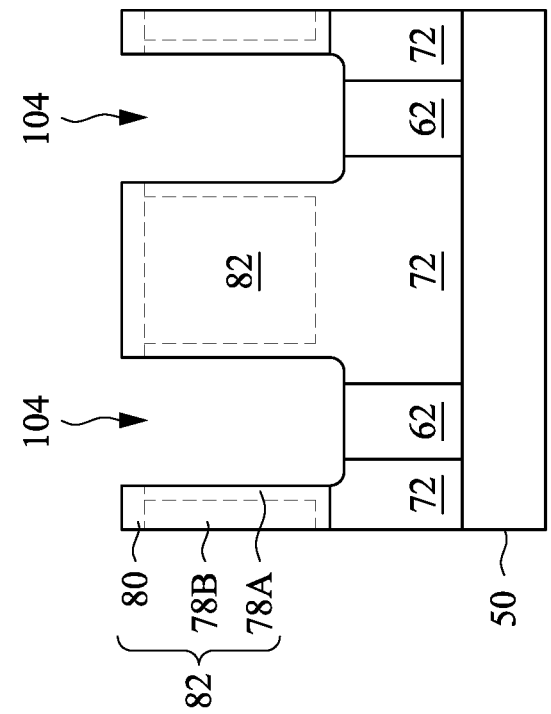
Figure 22B:
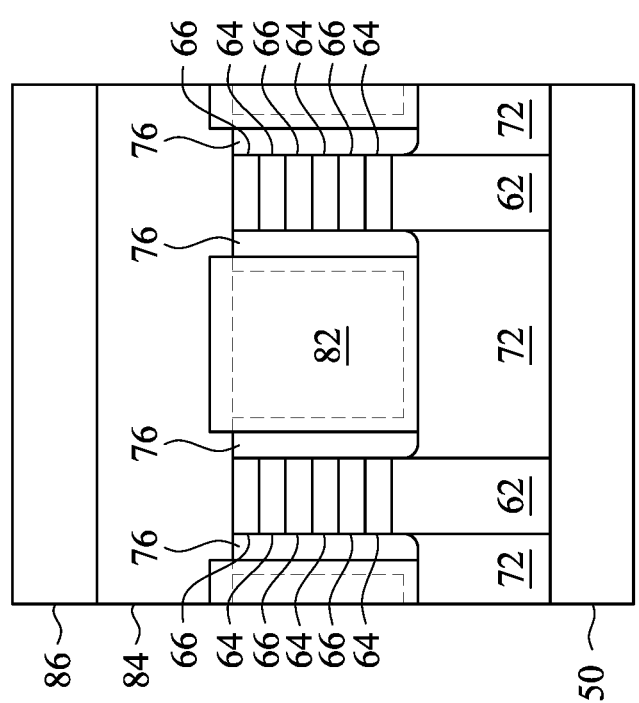

In FIGS. 22A-C, source/drain recesses 104 are formed in the nanostructures 64, 66 and the sacrificial spacers 76. In the illustrated embodiment, the source/drain recesses 104 extend through the nanostructures 64, 66 and the sacrificial spacers 76 into the semiconductor fins 62. The source/drain recesses 104 may also extend into the substrate 50. In various embodiments, the source/drain recesses 104 may extend to a top surface of the substrate 50 without etching the substrate 50; the semiconductor fins 62 may be etched such that bottom surfaces of the source/drain recesses 104 are disposed below the top surfaces of the STI regions 72; or the like. The source/drain recesses 104 may be formed by etching the nanostructures 64, 66 and the sacrificial spacers 76 using an anisotropic etching processes, such as a RIE, a NBE, or the like. The gate spacers 98 and the dummy gates 94 collectively mask portions of the semiconductor fins 62 and/or the nanostructures 64, 66 during the etching processes used to form the source/drain recesses 104. A single etch process may be used to etch each of the nanostructures 64, 66 and the sacrificial spacers 76, or multiple etch processes may be used to etch the nanostructures 64, 66 and the sacrificial spacers 76. Timed etch processes may be used to stop the etching of the source/drain recesses 104 after the source/drain recesses 104 reach a desired depth.

Optionally, inner spacers 106 are formed on the sidewalls of the nano structures 64, e.g., those sidewalls exposed by the source/drain recesses 104. As will be subsequently described in greater detail, source/drain regions will be subsequently formed in the source/drain recesses 104, and the nanostructures 64 will be subsequently replaced with corresponding gate structures. The inner spacers 106 act as isolation features between the subsequently formed source/drain regions and the subsequently formed gate structures. Further, the inner spacers 106 may be used to substantially prevent damage to the subsequently formed source/drain regions by subsequent etching processes, such as etching processes used to subsequently remove the nanostructures 64.

As an example to form the inner spacers 106, the source/drain recesses 104 can be laterally expanded. Specifically, portions of the sidewalls of the nanostructures 64 exposed by the source/drain recesses 104 may be recessed. Although sidewalls of the nanostructures 64 are illustrated as being concave, the sidewalls may be straight or convex. The sidewalls may be recessed by any acceptable etching process, such as one that is selective to the nanostructures 64 (e.g., selectively etches the materials of the nanostructures 64 at a faster rate than the material of the nanostructures 66). The etching may be isotropic. For example, when the nanostructures 66 are formed of silicon and the nanostructures 64 are formed of silicon germanium, the etching process may be a wet etch using tetramethylammonium hydroxide (TMAH), ammonium hydroxide (NH$_4$OH), or the like. In another embodiment, the etching process may be a dry etch using a fluorine-based gas such as hydrogen fluoride (HF) gas. In some embodiments, the same etching process may be continually performed to both form the source/drain recesses 104 and recess the sidewalls of the nanostructures 64. The inner spacers 106 are then formed on the recessed sidewalls of the nanostructures 64. The inner spacers 106 can be formed by conformally forming an insulating material and subsequently etching the insulating material. The insulating material may be silicon nitride or silicon oxynitride, although any suitable material, such as a low-k dielectric material, may be utilized. The insulating material may be deposited by a conformal deposition process, such as ALD, CVD, or the like. The etching of the insulating material may be anisotropic. For example, the etching process may be a dry etch such as a RIE, a NBE, or the like. Although outer sidewalls of the inner spacers 106 are illustrated as being recessed with respect to the sidewalls of the gate spacers 98, the outer sidewalls of the inner spacers 106 may extend beyond or be flush with the sidewalls of the gate spacers 98. In other words, the inner spacers 106 may partially fill, completely fill, or overfill the sidewall recesses. Moreover, although the sidewalls of the inner spacers 106 are illustrated as being concave, the sidewalls of the inner spacers 106 may be straight or convex.

Figure 23A:
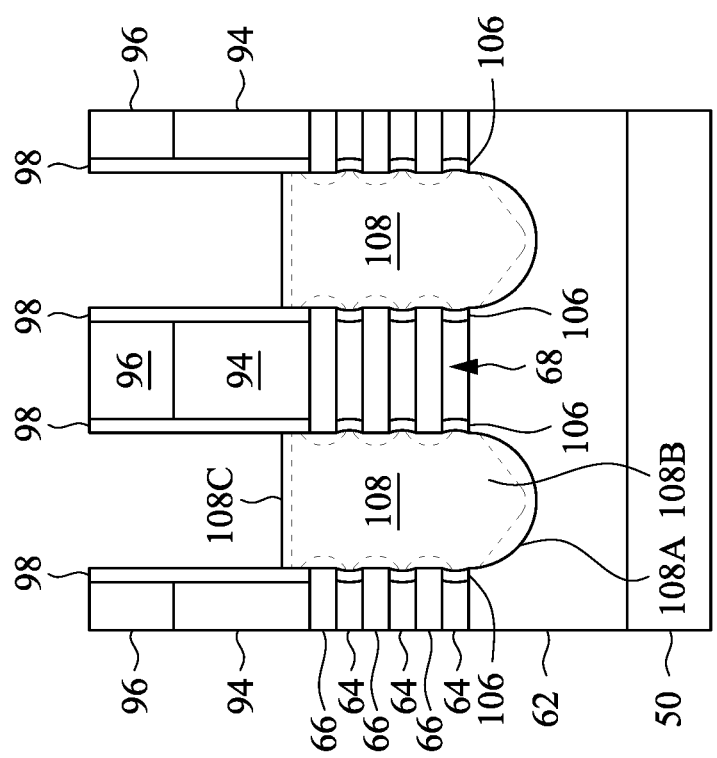
Figure 23C:
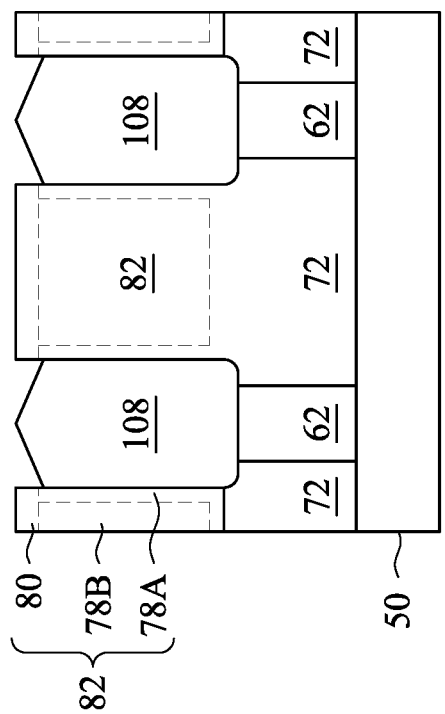
Figure 23B:
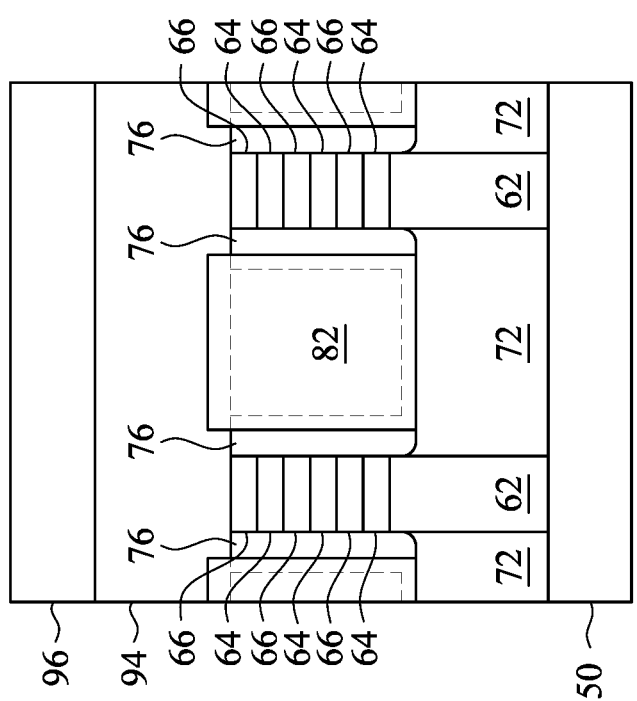

In FIGS. 23A-C epitaxial source/drain regions 108 are formed in the source/drain recesses 104. The epitaxial source/drain regions 108 are formed in recesses 104 such that each dummy gate 94 (and corresponding channel region 68) is disposed between respective adjacent pairs of the epitaxial source/drain regions 108. In some embodiments, the gate spacers 98 and the inner spacers 106 are used to separate the epitaxial source/drain regions 108 from, respectively, the dummy gates 94 and the nanostructures 64 by an appropriate lateral distance so that the epitaxial source/drain regions 108 do not short out with subsequently formed gates of the resulting nano-FETs. A material of the epitaxial source/drain regions 108 may be selected to exert stress in the respective channel regions 68, thereby improving performance.

The epitaxial source/drain regions 108 in the n-type region 50N may be formed by masking the p-type region 50P. Then, the epitaxial source/drain regions 108 in the n-type region 50N are epitaxially grown in the source/drain recesses 104 in the n-type region 50N. The epitaxial source/drain regions 108 may include any acceptable material appropriate for n-type devices. For example, if the nanostructures 66 are silicon, the epitaxial source/drain regions 108 in the n-type region 50N may include materials exerting a tensile strain on the channel regions 68, such as silicon, silicon carbide, phosphorous doped silicon carbide, silicon arsenide, silicon phosphide, or the like. The epitaxial source/drain regions 108 in the n-type region 50N may be referred to as "n-type source/drain regions." The epitaxial source/drain regions 108 in the n-type region 50N may have surfaces raised from respective surfaces of the semiconductor fins 62 and the nanostructures 64, 66, and may have facets.

The epitaxial source/drain regions 108 in the p-type region 50P may be formed by masking the n-type region 50N. Then, the epitaxial source/drain regions 108 in the p-type region 50P are epitaxially grown in the source/drain recesses 104 in the p-type region 50P. The epitaxial source/drain regions 108 may include any acceptable material appropriate for p-type devices. For example, if the nanostructures 66 are silicon, the epitaxial source/drain regions 108 in the p-type region 50P may include materials exerting a compressive strain on the channel regions 68, such as silicon germanium, boron doped silicon germanium, silicon germanium phosphide, germanium, germanium tin, or the like. The epitaxial source/drain regions 108 in the p-type region 50P may be referred to as "p-type source/drain regions." The epitaxial source/drain regions 108 in the p-type region 50P may have surfaces raised from respective surfaces of the semiconductor fins 62 and the nanostructures 64, 66, and may have facets.

The epitaxial source/drain regions 108, the nanostructures 64, 66, and/or the semiconductor fins 62 may be implanted with impurities to form source/drain regions, similar to the process previously described for forming LDD regions, followed by an anneal. The epitaxial source/drain regions 108 may have an impurity concentration in the range of $10^{19}$ cm$^{-3}$ to $10^{21}$ cm$^{-3}$. The n-type and/or p-type impurities for source/drain regions may be any of the impurities previously described. In some embodiments, the epitaxial source/drain regions 108 may be in situ doped during growth.

The epitaxial source/drain regions 108 may include one or more semiconductor material layers. For example, the epitaxial source/drain regions 108 may each include a liner layer 108A, a main layer 108B, and a finishing layer 108C (or more generally, a first semiconductor material layer, a second semiconductor material layer, and a third semiconductor material layer). Any number of semiconductor material layers may be used for the epitaxial source/drain regions 108. Each of the liner layer 108A, the main layer 108B, and the finishing layer 108C may be formed of different semiconductor materials and may be doped to different impurity concentrations. In some embodiments, the liner layer 108A may have a lesser concentration of impurities than the main layer 108B, and the finishing layer 108C may have a greater concentration of impurities than the liner layer 108A and a lesser concentration of impurities than the main layer 108B. In embodiments in which the epitaxial source/drain regions include three semiconductor material layers, the liner layers 108A may be grown in the source/drain recesses 104, the main layers 108B may be grown on the liner layers 108A, and the finishing layers 108C may be grown on the main layers 108B.

As a result of the epitaxy processes used to form the epitaxial source/drain regions 108, upper surfaces of the epitaxial source/drain regions have facets which expand laterally outward beyond sidewalls of the semiconductor fins 62 and the nanostructures 64, 66. However, the insulating fins 82 block the lateral epitaxial growth. Therefore, adjacent epitaxial source/drain regions 108 remain separated after the epitaxy process is completed as illustrated by FIG. 27C. The epitaxial source/drain regions 108 contact the sidewalls of the insulating fins 82. In the illustrated embodiment, the epitaxial source/drain regions 108 are grown so that the upper surfaces of the epitaxial source/drain regions 108 are disposed below the top surfaces of the insulating fins 82. In various embodiments, the upper surfaces of the epitaxial source/drain regions 108 are disposed above the top surfaces of the insulating fins 82; the upper surfaces of the epitaxial source/drain regions 108 have portions disposed above and below the top surfaces of the insulating fins 82; or the like.

Figure 24A:
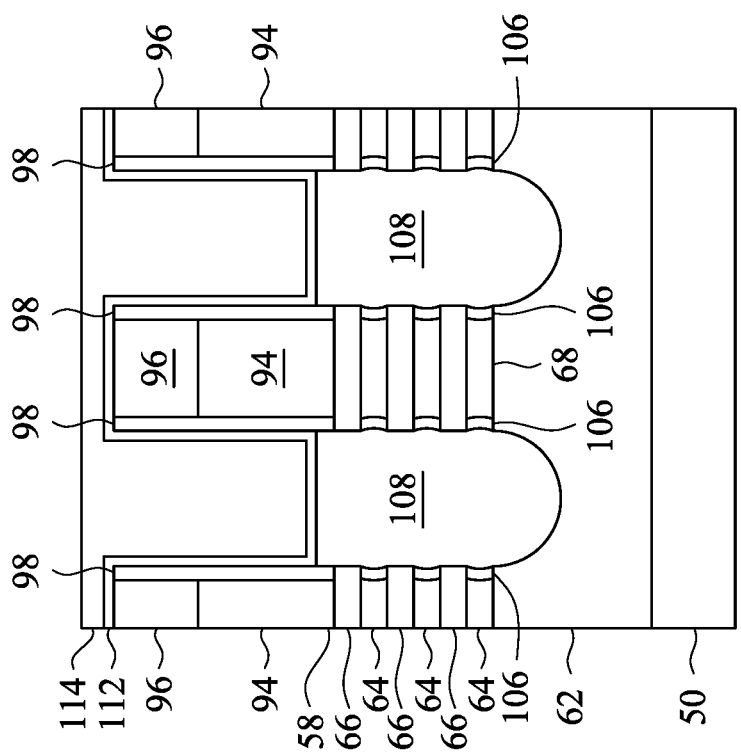
Figure 24C:
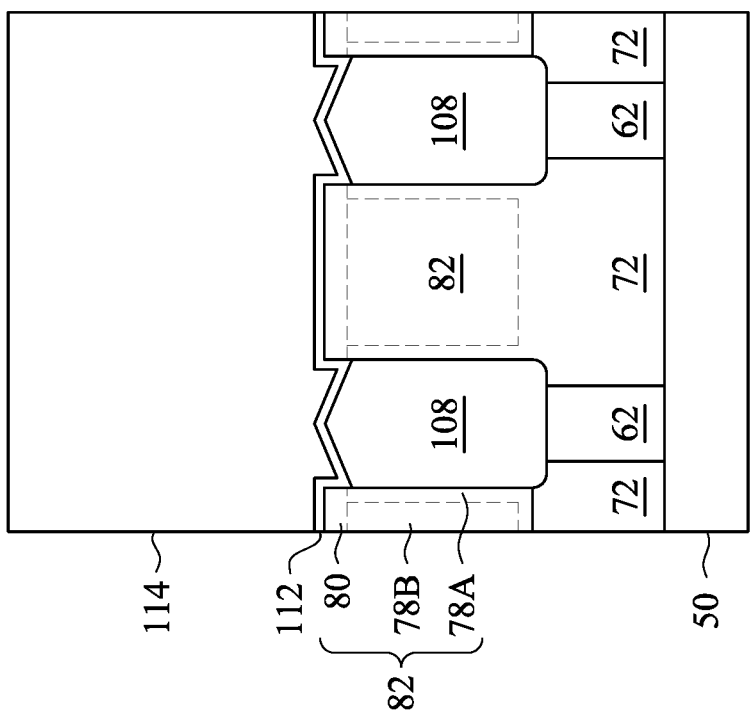
Figure 24B:
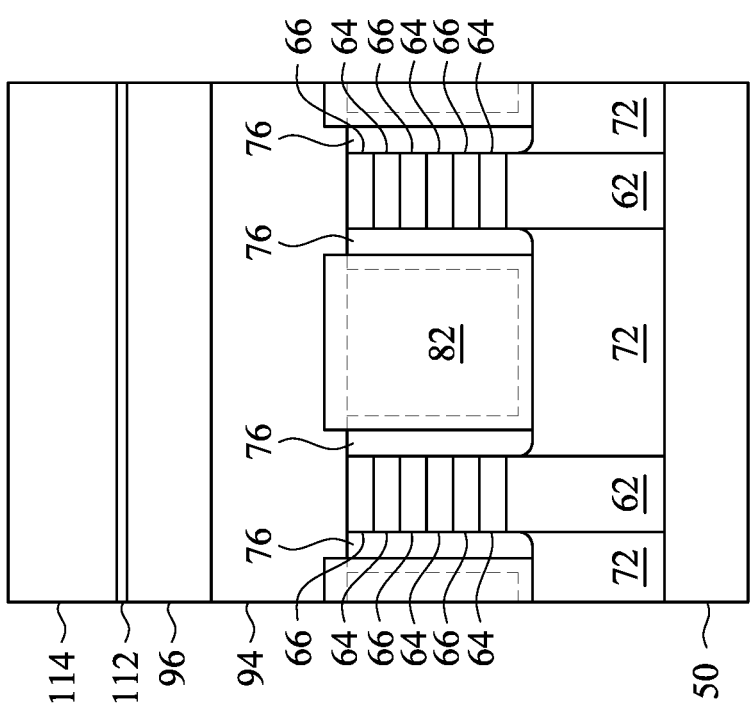

In FIGS. 24A-C, a first inter-layer dielectric (ILD) 114 is deposited over the epitaxial source/drain regions 108, the gate spacers 98, the masks 96 (if present) or the dummy gates 94. The first ILD 114 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, the first ILD 114 may be formed of the same or similar material as the STI regions 72. Further, when FCVD is used to deposit the first ILD 114, the depositing techniques and the treatment techniques described with respect to FIGS. 4 and 5 may be used to deposit and treat a flowable dielectric film over the epitaxial source/drain regions 108, the gate spacers 98, the masks 96 (if present) or the dummy gates 94. In addition, the multi-step anneal process described with respect to FIGS. 6 through 8 may be used after the first ILD 114 is deposited and treated to improve the oxide quality of the first ILD 114. The embodiment multi-step anneal process are beneficial and can be applied to various structural scenarios related to the first ILD 114. For example, if the widths of the trenches occupied by the first ILD 114 vary greatly (e.g., from 17 nm to 500 nm), or the heights of the trenches are deep (e.g., greater than 200 nm), or the aspect ratios (height over width) of the trenches are high (e.g., between 2 to 40), the embodiment multi-step anneal process may be used to improve the FCVD quality and reduce the total thermal budget for process integration. In some embodiments, the nitrogen concentration (e.g., by atomic percentage) in the first ILD 114 may be less than 1% throughout. Further, the nitrogen concentration in the first ILD 114 may decrease as the depth of the first ILD 114 increases (e.g., in the direction from the top edge of the first ILD 114 to the bottom edge of the first ILD 114, towards the underlying substrate 50). In some embodiments, the decrease of the nitrogen concentration in the first ILD 114 over the depth may be or close to be linear.

In some embodiments, a contact etch stop layer (CESL) 112 is formed between the first ILD 114 and the epitaxial source/drain regions 108, the gate spacers 98, and the masks 96 (if present) or the dummy gates 94. The CESL 112 may be formed of a dielectric material, such as silicon nitride, silicon oxide, silicon oxynitride, or the like, having a high etching selectivity from the etching of the first ILD 114. The CESL 112 may be formed by any suitable method, such as CVD, ALD, or the like.

Figure 25A:
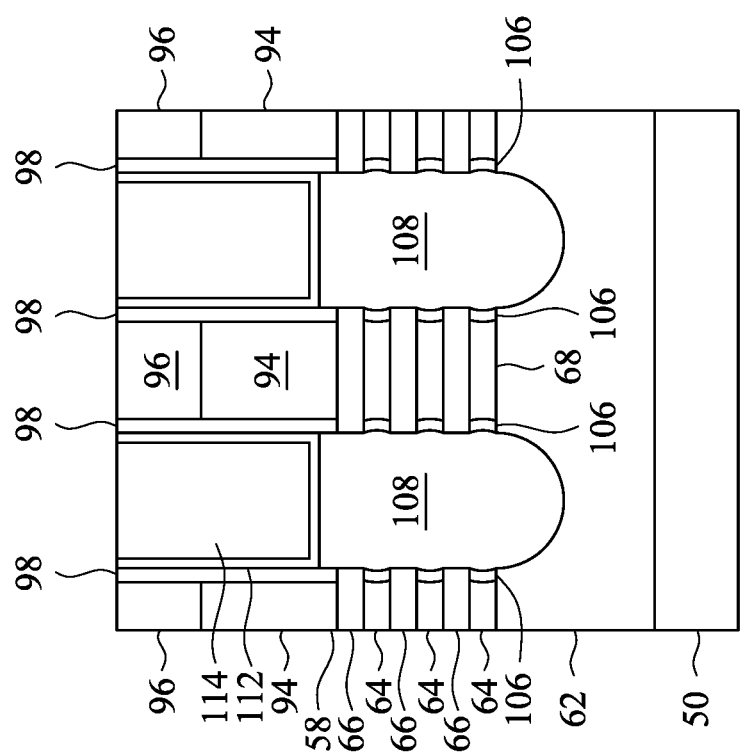
Figure 25C:
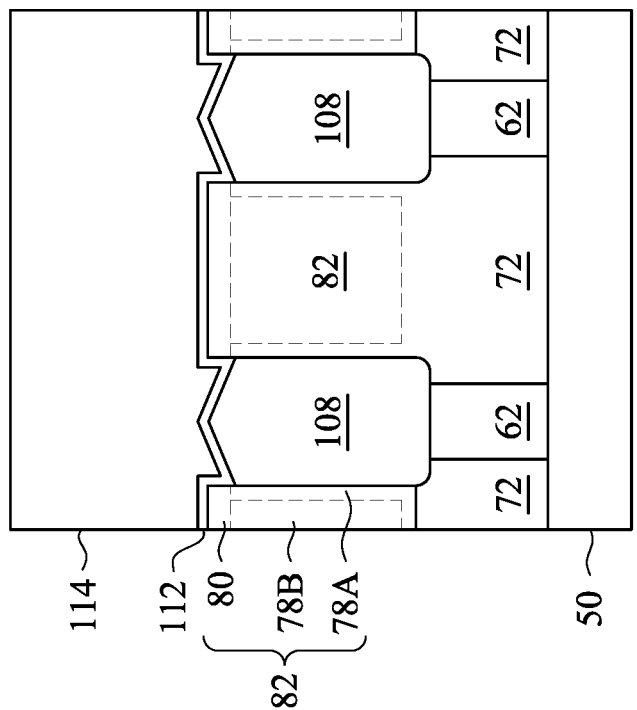
Figure 25B:
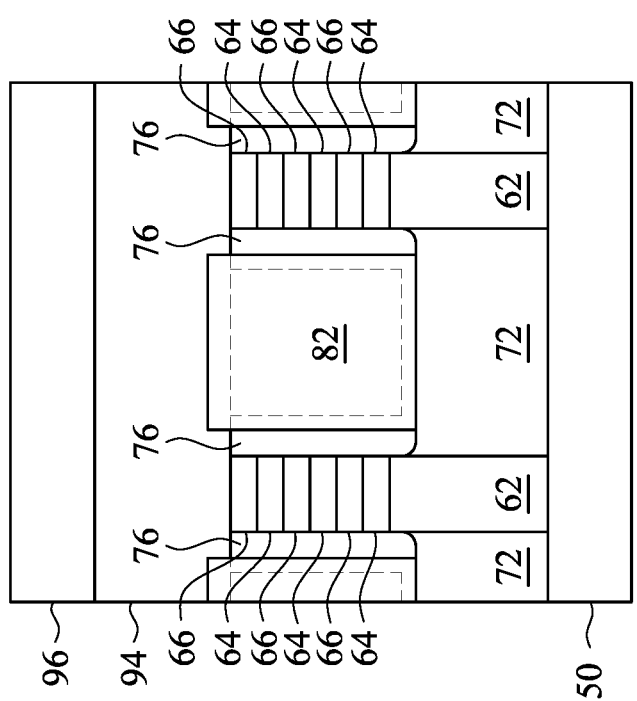

In FIGS. 25A-C, a removal process is performed to level the top surfaces of the first ILD 114 with the top surfaces of the masks 96 (if present) or the dummy gates 94. In some embodiments, a planarization process such as a chemical mechanical polish (CMP), an etch-back process, combinations thereof, or the like may be utilized. The planarization process may also remove the masks 96 on the dummy gates 94, and portions of the gate spacers 98 along sidewalls of the masks 96. After the planarization process, the top surfaces of the gate spacers 98, the first ILD 114, the CESL 112, and the masks 96 (if present) or the dummy gates 94 are coplanar (within process variations). Accordingly, the top surfaces of the masks 96 (if present) or the dummy gates 94 are exposed through the first ILD 114. In the illustrated embodiment, the masks 96 remain, and the planarization process levels the top surfaces of the first ILD 114 with the top surfaces of the masks 96.

Figure 26A:
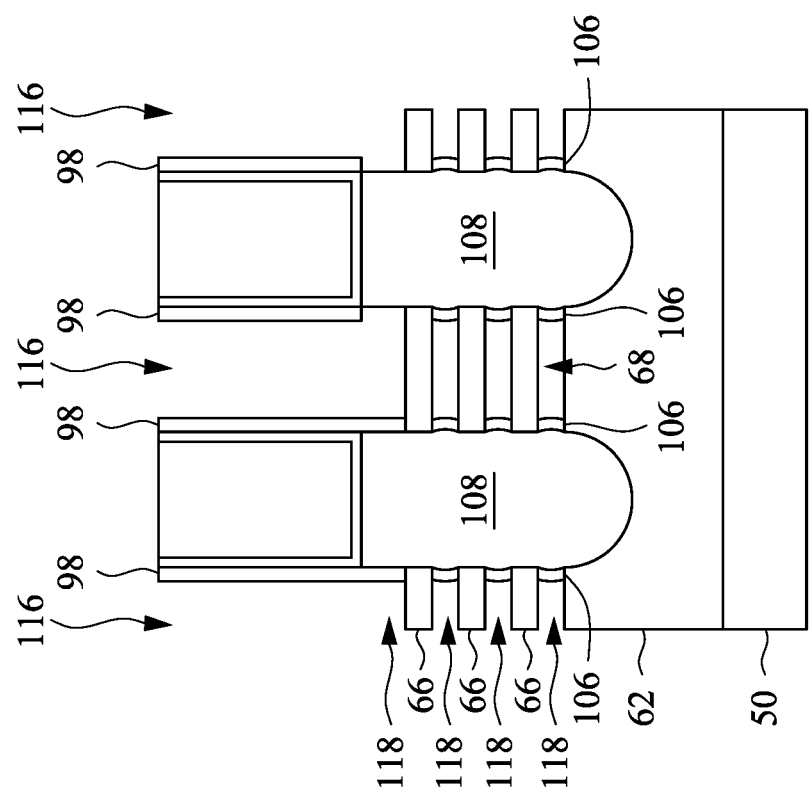
Figure 26C:
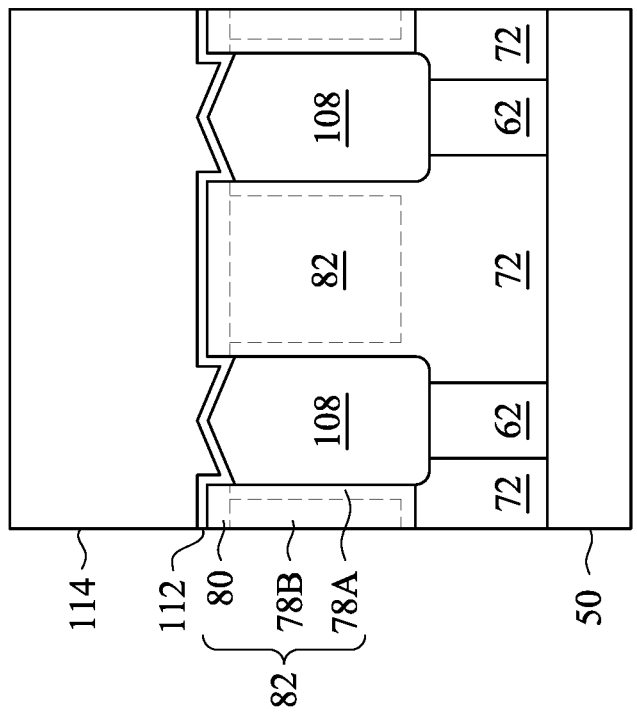
Figure 26B:
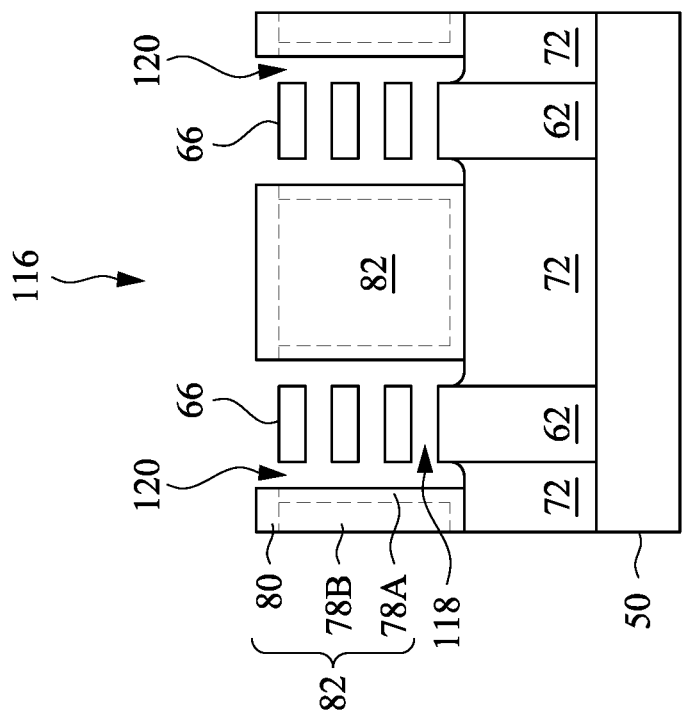

In FIGS. 26A-C, the masks 96 (if present) and the dummy gates 94 are removed in an etching process, so that recesses 116 are formed. In some embodiments, the dummy gates 94 are removed by an anisotropic dry etch process. For example, the etching process may include a dry etch process using reaction gas(es) that selectively etch the dummy gates 94 at a faster rate than the first ILD 114 or the gate spacers 98. Each recess 116 exposes and/or overlies portions of the channel regions 68. Portions of the nanostructures 66 which act as the channel regions 68 are disposed between adjacent pairs of the epitaxial source/drain regions 108.

The remaining portions of the nanostructures 64 are then removed to expand the recesses 116, such that openings 118 are formed in regions between the nanostructures 66. The remaining portions of the sacrificial spacers 76 are also removed to expand the recesses 116, such that openings 120 are formed in regions between semiconductor fins 62 and the insulating fins 82. The remaining portions of the nanostructures 64 and the sacrificial spacers 76 can be removed by any acceptable etching process that selectively etches the material(s) of the nanostructures 64 and the sacrificial spacers 76 at a faster rate than the material of the nanostructures 66. The etching may be isotropic. For example, when the nanostructures 64 and the sacrificial spacers 76 are formed of silicon germanium and the nanostructures 66 are formed of silicon, the etching process may be a wet etch using tetramethylammonium hydroxide (TMAH), ammonium hydroxide ($NH_4OH$), or the like. The masks 58 (if present) may also be removed. In some embodiments, a trim process (not separately illustrated) is performed to decrease the thicknesses of the exposed portions of the nanostructures 66.

Figure 27A:
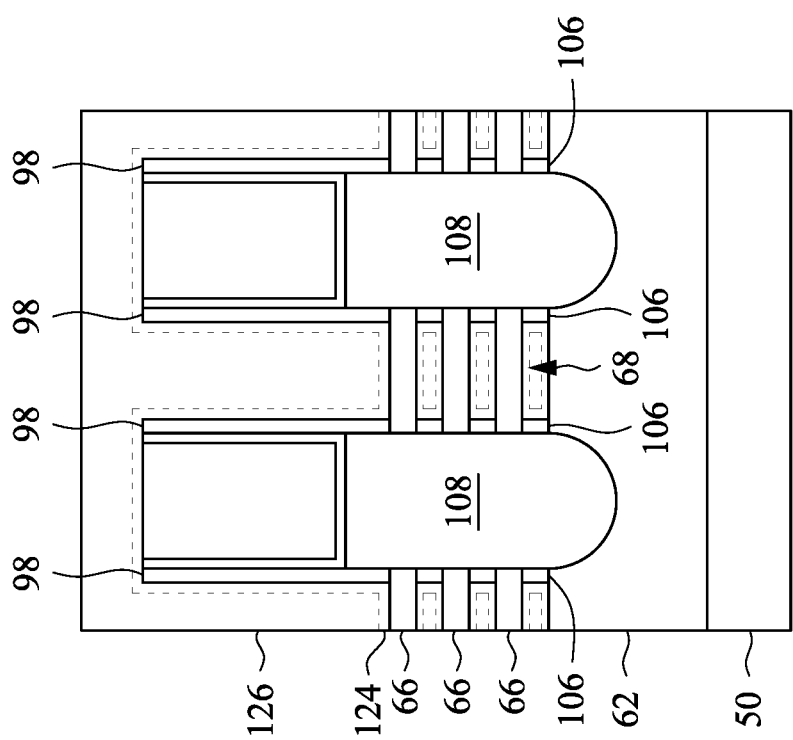
Figure 27C:
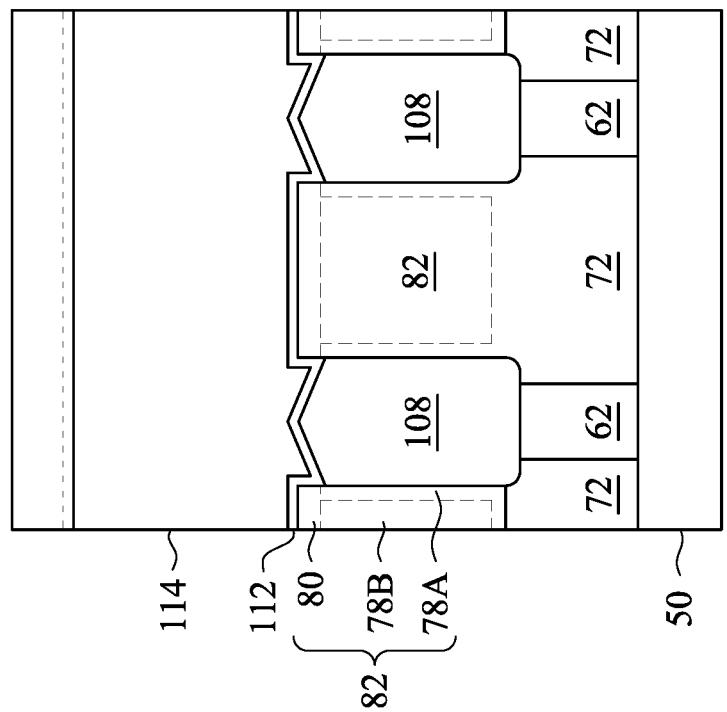
Figure 27B:
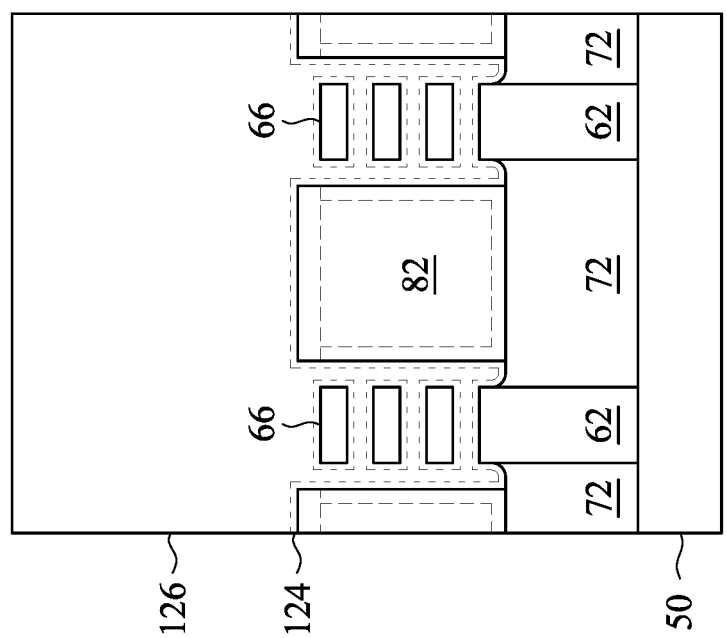

In FIGS. 27A-C, a gate dielectric layer 124 is formed in the recesses 116. A gate electrode layer 126 is formed on the gate dielectric layer 124. The gate dielectric layer 124 and the gate electrode layer 126 are layers for replacement gates, and each wrap around all (e.g., four) sides of the nanostructures 66. Thus, the gate dielectric layer 124 and the gate electrode layer 126 are formed in the openings 118 and the openings 120 (see FIGS. 26A-C).

The gate dielectric layer 124 is disposed on the sidewalls and/or the top surfaces of the semiconductor fins 62; on the top surfaces, the sidewalls, and the bottom surfaces of the nanostructures 66; on the sidewalls of the inner spacers 106 adjacent the epitaxial source/drain regions 108 and the gate spacers 98 on top surfaces of the top inner spacers 106; and on the top surfaces and the sidewalls of the insulating fins 82. The gate dielectric layer 124 may also be formed on the top surfaces of the first ILD 114 and the gate spacers 98. The gate dielectric layer 124 may include an oxide such as silicon oxide or a metal oxide, a silicate such as a metal silicate, combinations thereof, multi-layers thereof, or the like. The gate dielectric layer 124 may include a high-k dielectric material (e.g., a dielectric material having a k-value greater than about 7.0), such as a metal oxide or a silicate of hafnium, aluminum, zirconium, lanthanum, manganese, barium, titanium, lead, and combinations thereof. Although a single-layered gate dielectric layer 124 is illustrated in FIGS. 27A-C, the gate dielectric layer 124 may include any number of interfacial layers and any number of main layers.

The gate electrode layer 126 may include a metal-containing material such as titanium nitride, titanium oxide, tungsten, cobalt, ruthenium, aluminum, combinations thereof, multi-layers thereof, or the like. Although a single-layered gate electrode layer 126 is illustrated in FIGS. 27A-C, the gate electrode layer 126 may include any number of work function tuning layers, any number of barrier layers, any number of glue layers, and a fill material.

The formation of the gate dielectric layers 124 in the n-type region 50N and the p-type region 50P may occur simultaneously such that the gate dielectric layers 124 in each region are formed of the same materials, and the formation of the gate electrode layers 126 may occur simultaneously such that the gate electrode layers 126 in each region are formed of the same materials. In some embodiments, the gate dielectric layers 124 in each region may be formed by distinct processes, such that the gate dielectric layers 124 may be different materials and/or have a different number of layers, and/or the gate electrode layers 126 in each region may be formed by distinct processes, such that the gate electrode layers 126 may be different materials and/or have a different number of layers. Various masking steps may be used to mask and expose appropriate regions when using distinct processes.

Figure 28A:
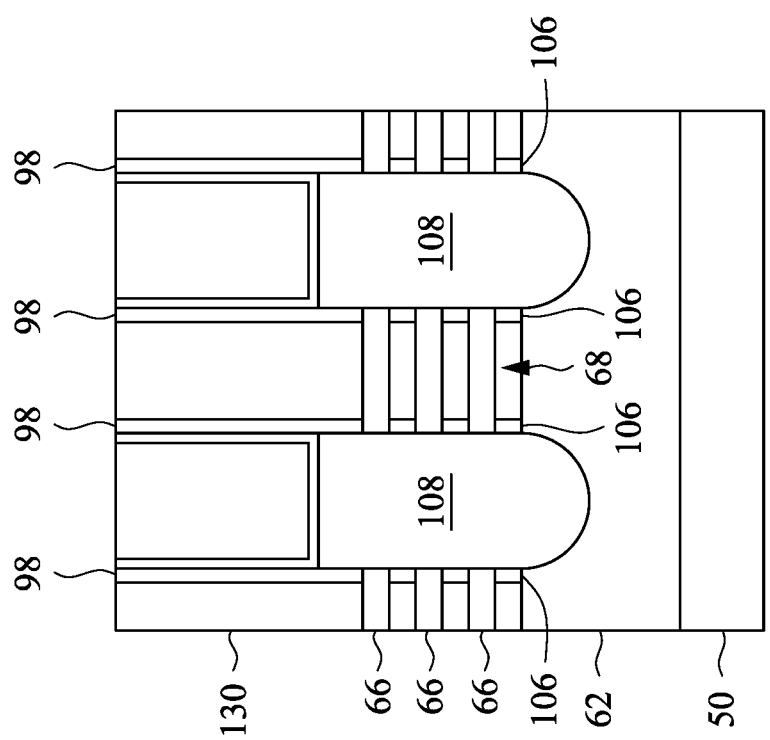
Figure 28C:
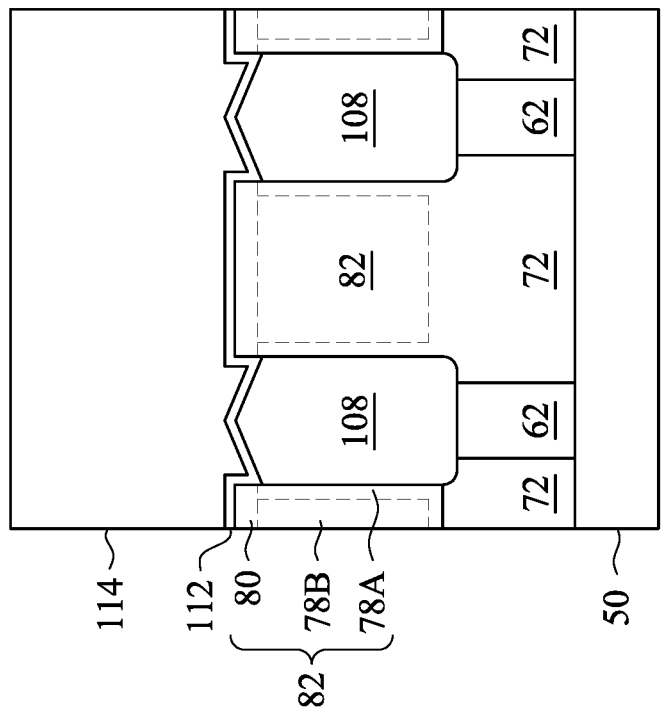
Figure 28B:
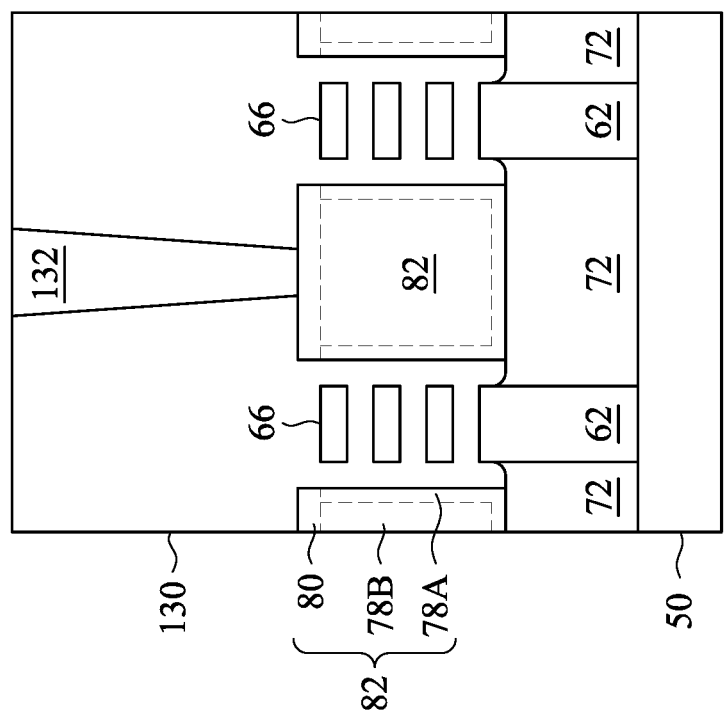

In FIGS. 28A-C, a removal process is performed to remove the excess portions of the materials of the gate dielectric layer 124 and the gate electrode layer 126, which excess portions are over the top surfaces of the first ILD 114 and the gate spacers 98, thereby forming gate structures 130. In some embodiments, a planarization process such as a chemical mechanical polish (CMP), an etch-back process, combinations thereof, or the like may be utilized. The gate dielectric layer 124, when planarized, has portions left in the recesses 116 (thus forming gate dielectrics for the gate structures 130). The gate electrode layer 126, when planarized, has portions left in the recesses 116 (thus forming gate electrodes for the gate structures 130). The top surfaces of the gate spacers 98; the CESL 112; the first ILD 114; and the gate structures 130 are coplanar (within process variations). The gate structures 130 are replacement gates of the resulting nano-FETs, and may be referred to as "metal gates." The gate structures 130 each extend along top surfaces, sidewalls, and bottom surfaces of a channel region 68 of the nanostructures 66. The gate structures 130 fill the area previously occupied by the nanostructures 64, the sacrificial spacers 76, and the dummy gates 94.

In some embodiments, isolation regions 132 are formed extending through some of the gate structures 130. An isolation region 132 is formed to divide (or "cut") a gate structure 130 into multiple gate structures 130. The isolation region 132 may be formed of a dielectric material, such as silicon nitride, silicon oxide, silicon oxynitride, or the like, which may be formed by a deposition process such as CVD, ALD, or the like. As an example to form the isolation regions 132, openings can be patterned in the desired gate structures 130. Any acceptable etch process, such as a dry etch, a wet etch, the like, or a combination thereof, may be performed to pattern the openings. The etching may be anisotropic. One or more layers of dielectric material may be deposited in the openings. A removal process may be performed to remove the excess portions of the dielectric material, which excess portions are over the top surfaces of the gate structures 130, thereby forming the isolation regions 132.

Figure 29A:
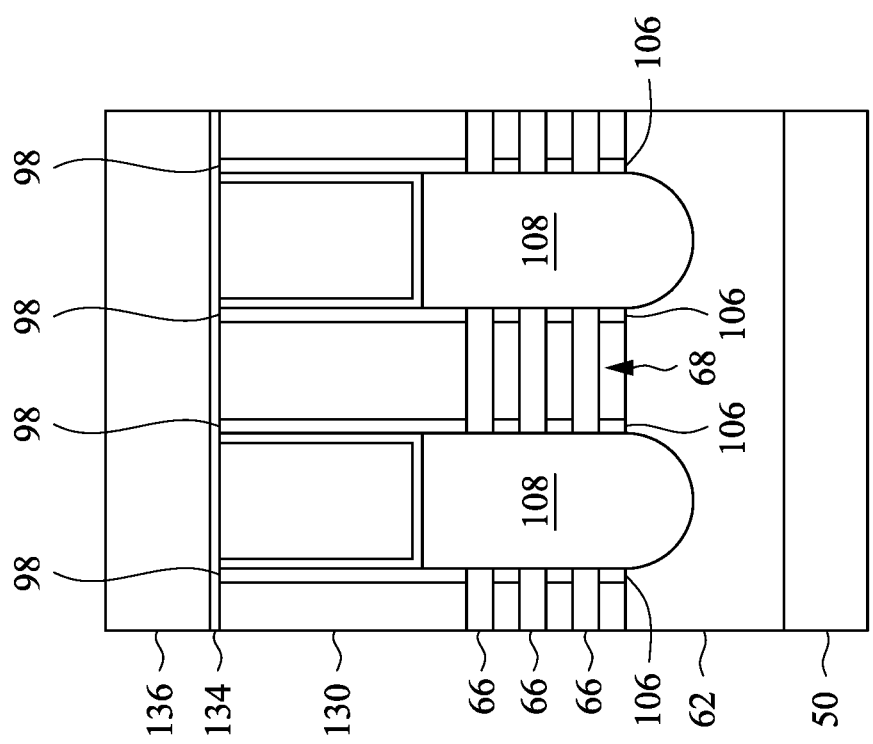
Figure 29C:
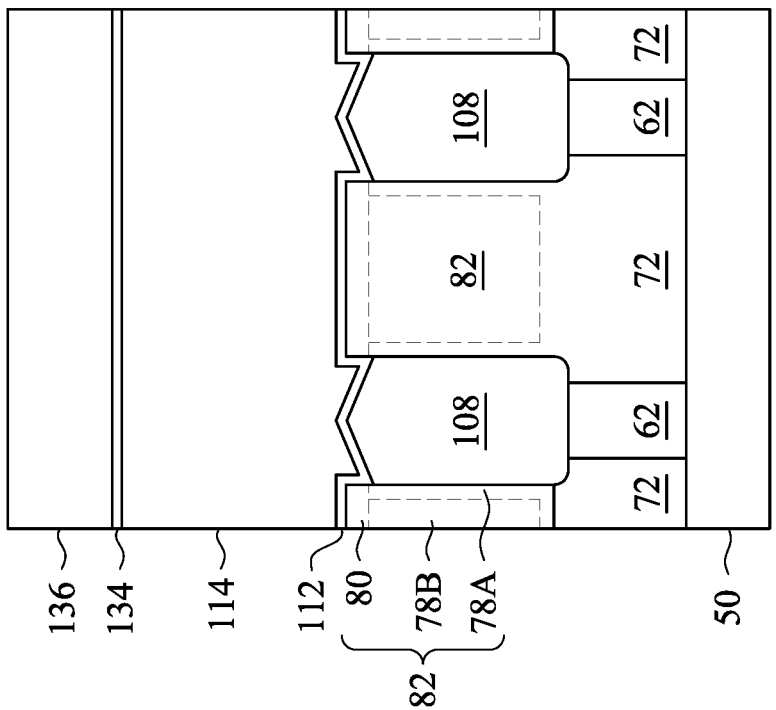
Figure 29B:
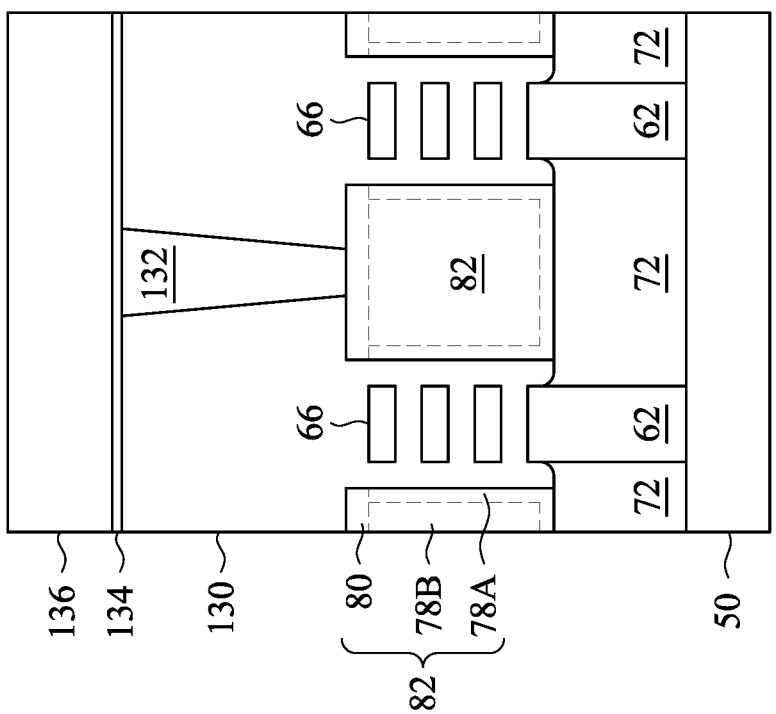

In FIGS. 29A-C, a second ILD 136 is deposited over the gate spacers 98, the CESL 112, the first ILD 114, and the gate structures 130. In some embodiments, the second ILD 136 is a flowable film formed by a flowable CVD method. In some embodiments, the second ILD 136 is formed of a dielectric material such as PSG, BSG, BPSG, USG, or the like, which may be deposited by any suitable method, such as CVD, PECVD, or the like.

In some embodiments, an etch stop layer (ESL) 134 is formed between the second ILD 136 and the gate spacers 98, the CESL 112, the first ILD 114, and the gate structures 130. The ESL 134 may include a dielectric material, such as silicon nitride, silicon oxide, silicon oxynitride, or the like, having a high etching selectivity from the etching of the second ILD 136.

Figure 30A:
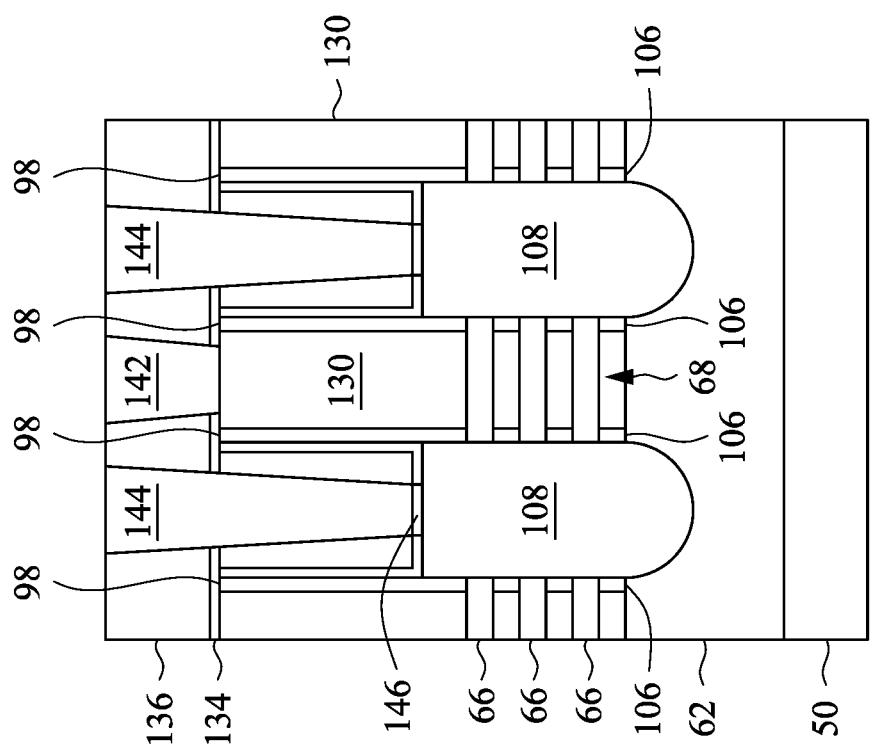
Figure 30C:
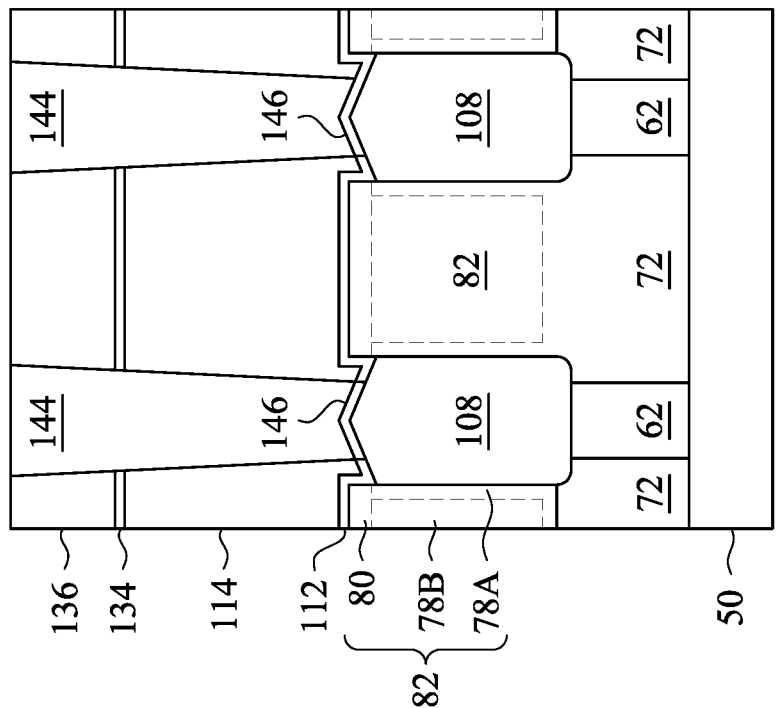
Figure 30B:
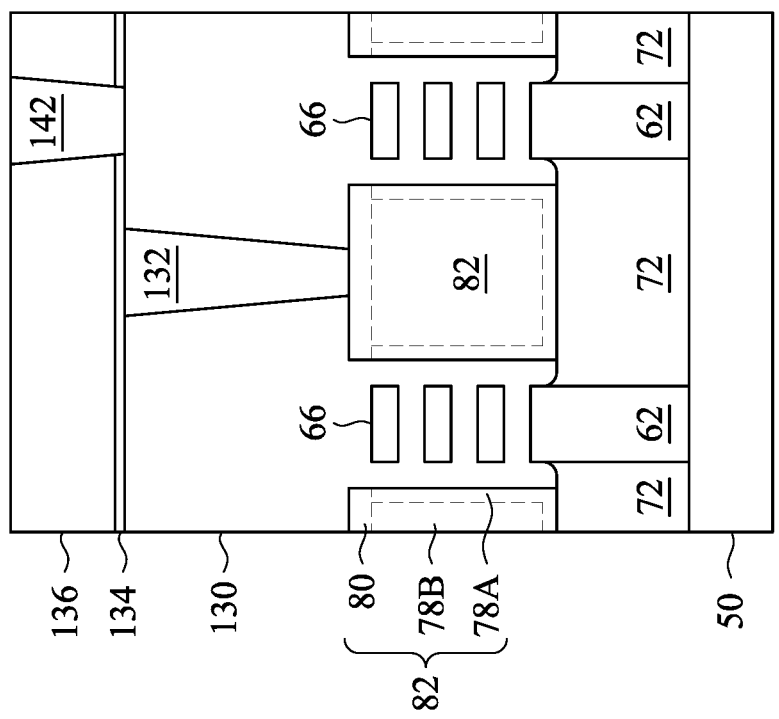

In FIGS. 30A-C, gate contacts 142 and source/drain contacts 144 are formed to contact, respectively, the gate structures 130 and the epitaxial source/drain regions 108. The gate contacts 142 are physically and electrically coupled to the gate structures 130. The source/drain contacts 144 are physically and electrically coupled to the epitaxial source/drain regions 108.

As an example to form the gate contacts 142 and the source/drain contacts 144, openings for the gate contacts 142 are formed through the second ILD 136 and the ESL 134, and openings for the source/drain contacts 144 are formed through the second ILD 136, the ESL 134, the first ILD 114, and the CESL 112. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 136. The remaining liner and conductive material form the gate contacts 142 and the source/drain contacts 144 in the openings. The gate contacts 142 and the source/drain contacts 144 may be formed in distinct processes, or may be formed in the same process. Although shown as being formed in the same cross-sections, it should be appreciated that each of the gate contacts 142 and the source/drain contacts 144 may be formed in different cross-sections, which may avoid shorting of the contacts.

Optionally, metal-semiconductor alloy regions 146 are formed at the interfaces between the epitaxial source/drain regions 108 and the source/drain contacts 144. The metal-semiconductor alloy regions 146 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 146 can be formed before the material(s) of the source/drain contacts 144 by depositing a metal in the openings for the source/drain contacts 144 and then performing a thermal anneal process. The metal can be any metal capable of reacting with the semiconductor materials (e.g., silicon, silicon-germanium, germanium, etc.) of the epitaxial source/drain regions 108 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. After the thermal anneal process, a cleaning process, such as a wet clean, may be performed to remove any residual metal from the openings for the source/drain contacts 144, such as from surfaces of the metal-semiconductor alloy regions 146. The material(s) of the source/drain contacts 144 can then be formed on the metal-semiconductor alloy regions 146.

Various embodiment techniques in this disclosure, such as the multi-step anneal process described above, may be applied to dies including other types of transistors (e.g., fin field-effect transistors (FinFETs), planar transistors, or the like) in lieu of or in combination with the nano-FETs. For example, the multi-step anneal process described above may be applied to FinFETs.

Figure 31:
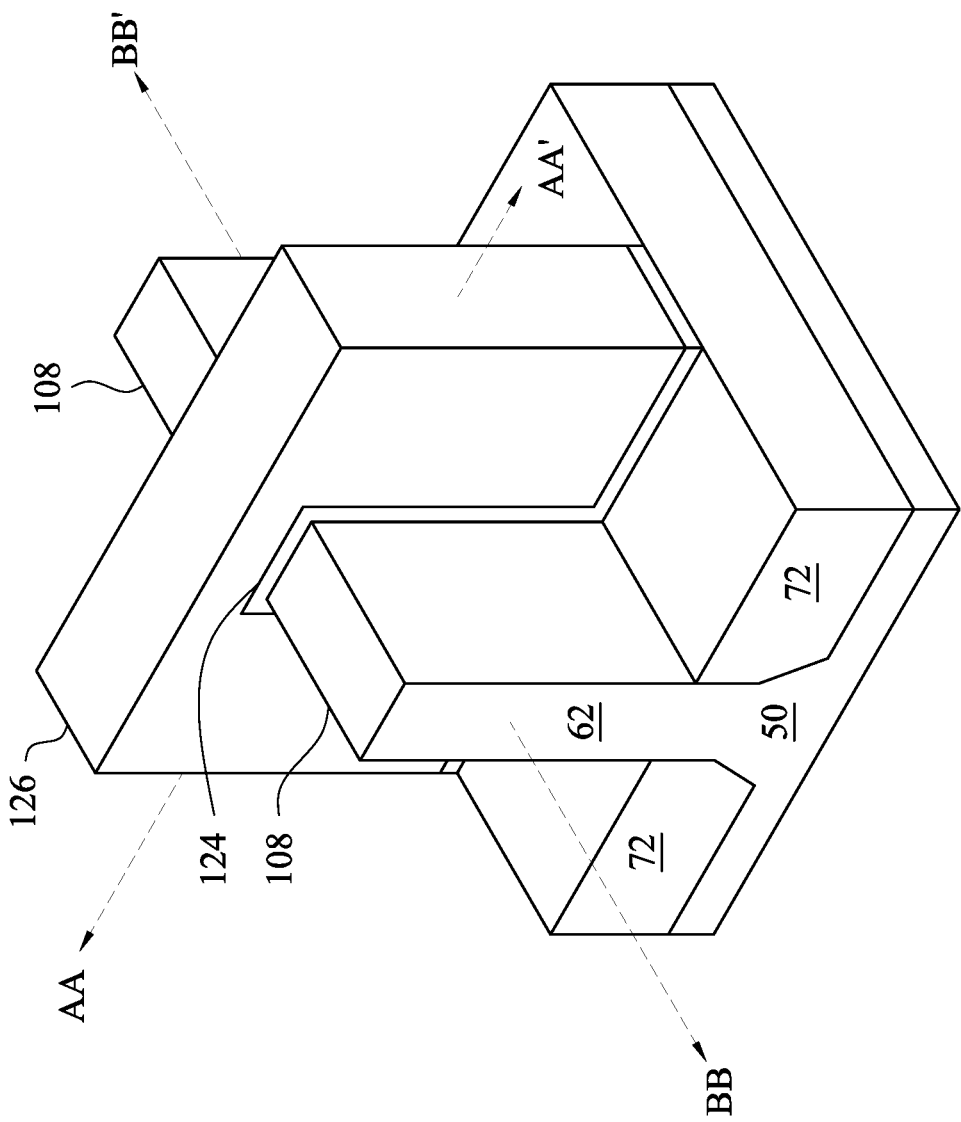
FIG. 31 illustrates an example of fin field-effect transistors (FinFETs) in a three-dimensional view, in accordance with some embodiments.

FIG. 31 illustrates an example of a FinFET in a three-dimensional view, in accordance with some embodiments. The FinFET comprises a fin 62 on a substrate 50 (e.g., a semiconductor substrate). Isolation regions (e.g., STI regions) 72 are disposed in the substrate 50, and the fin 62 protrudes above and from between neighboring isolation regions 72. Although the isolation regions 72 are described/illustrated as being separate from the substrate 50, as used herein the term "substrate" may be used to refer to just the semiconductor substrate or a semiconductor substrate inclusive of isolation regions. A gate dielectric layer 124 is along sidewalls and over a top surface of the fin 62, and a gate electrode 126 is over the gate dielectric layer 124. Source/drain regions 108 are disposed in opposite sides of the fin 62 with respect to the gate dielectric layer 124 and gate electrode 126. FIG. 31 further illustrates reference cross-sections that are used in later figures. Cross-section AA-AA' is along a longitudinal axis of the gate electrode 126 and in a direction, for example perpendicular to the direction of current flow between the source/drain regions 108 of the FinFET. Cross-section BB-BB' is perpendicular to cross-section AA-AA' and is along a longitudinal axis of the fin 62 and in a direction of, for example, a current flow between the source/drain regions 108 of the FinFET.

Figure 32B:
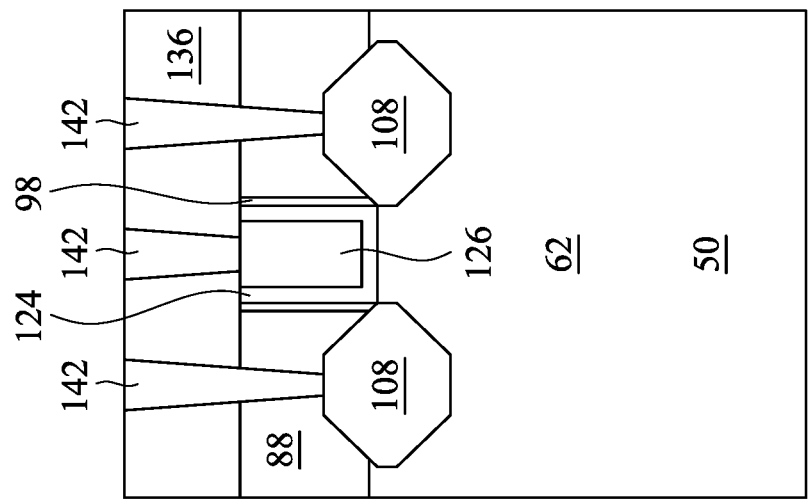
FIGS. 32A and 32B are cross-sectional views of intermediate stages in the manufacturing of FinFETs, in accordance with some embodiments.
Figure 32A:
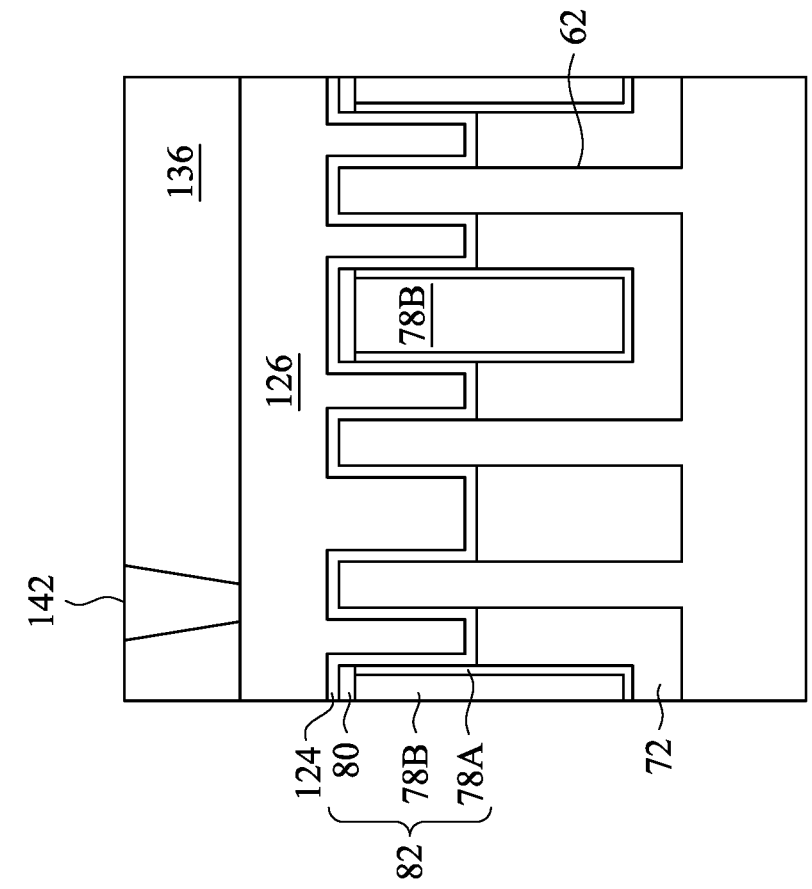

FIGS. 32A and 32B are cross-sectional views of a FinFET, in accordance with some embodiments. Various elements in FIGS. 32A and 32B may be similar to the nanoFET described above with respect to FIGS. 1 through 30C where like reference numerals indicate like elements formed by like processes. FIG. 32A is illustrated along reference cross-section AA-AA' illustrated in FIG. 31, and FIG. 32B is illustrated along a similar cross-section BB-BB' illustrated in FIG. 31.

FIGS. 32A and 32B further illustrate the STI regions 72, which may be formed using a similar process as described above with respect to FIGS. 4 to 11. For example, the STI regions 72 may be deposited using a FCVD process and may be initially formed in a flowable form as described above with respect to FIGS. 4 and 5. A multi-step annealing process described above with respect to FIGS. 6 through 8 may be performed to harden the flowable dielectric film into the STI regions 72. In some embodiments, the multi-step annealing process may include a first anneal that is performed at a relatively low temperature (e.g., at most 500° C.) for a relatively long duration (e.g., at least 5 hours). As a result, a relatively thin hard shell is formed during the anneal process, and the film quality of the resulting STI regions 72 can be improved.

After deposition, the STI region 72 may be etched to define openings and insulating fins 82 may be formed in the openings. The insulating fins 82 may include a dielectric layer 78A deposited over the STI regions 72 such that the dielectric layer 78A is disposed along sidewalls and top surfaces of the STI regions 72. The dielectric layer 78A may comprise a carbon-containing dielectric film (e.g., a carbon-containing nitride, such as, SiCN or a carbon-containing oxide, such as, SiOC), a metal-containing dielectric film (e.g., a metal-containing oxide, such as, a combination of SiO and a metal), combinations thereof, or the like. The insulating fins 82 may further include a dielectric layer 78B is deposited over the STI regions 72 and the dielectric layer 78A. The dielectric layer 78B may comprise a carbon-containing dielectric film (e.g., a carbon-containing nitride, such as, SiCN or a carbon-containing oxide, such as, SiOC), a metal-containing dielectric film (e.g., a metal-containing oxide, such as, a combination of SiO and a metal), or the like. The insulating fins may also include a dielectric capping layer 80 that is deposited over the dielectric layers 78A, 78B. The dielectric capping layer 80 may comprise a high-k material such as hafnium oxide, zirconium oxide, zirconium aluminum oxide, hafnium aluminum oxide, hafnium silicon oxide, aluminum oxide, the like, or combinations thereof. The upper portions of the dielectric layer 78A, the dielectric layer 78B, and the cap layer 80 that protrude above the STI regions 72 may be referred to collectively as dummy fins 82.

The embodiment multi-step anneal process may be applied to formation the STI regions 72, in accordance to some embodiments. For example, an insulation material may be deposited over the substrate 50 and between neighboring fins 62. The insulation material may be the same as or similar to the material of the dielectric film 172 described above, and may be formed by a FCVD process. The depositing techniques and the treatment techniques described with respect to FIGS. 4 and 5 may be used to deposit and treat the insulation material. The multi-step anneal process described with respect to FIGS. 6 through 8 may be performed after the insulation material is deposited and treated to improve the oxide quality. Then, the insulation material is recessed to form STI regions 72. The embodiment multi-step anneal process are beneficial and can be applied to various structural scenarios related to the STI regions 72. For example, if the distance between two adjacent fins 62 vary greatly (e.g., from 17 nm to 500 nm), or the heights of the fins 62 are deep (e.g., greater than 200 nm), or the aspect ratios (the height of a fin 62 over the distance between two adjacent fins 62) are high (e.g., between 2 to 40), the embodiment multi-step anneal process may be used to improve the FCVD quality and reduce the total thermal budget for process integration. In some embodiments, the nitrogen concentration (e.g., by atomic percentage) in the STI regions 72 may be less than 1% throughout. Further, the nitrogen concentration in the STI regions 72 may decrease as the depth of the STI regions 72 increases (e.g., in the direction from the top edge of the STI regions 72 to the bottom edge of the STI regions 72 towards the underlying substrate 50). In some embodiments, the decrease of the nitrogen concentration in the STI regions 72 over the depth may be or close to be linear.

The embodiment multi-step anneal process may be applied to formation the first ILD 88, in accordance to some embodiments. For example, the first ILD 88 may be deposited over the source/drain regions 108 and the gate spacers 98. The first ILD 88 may be made of the same or similar material as the material of first ILD 114 described above, and may be formed by a FCVD process. The depositing techniques and the treatment techniques described with respect to FIGS. 4 and 5 may be used to deposit and treat the first ILD 88. The embodiment multi-step anneal process described with respect to FIGS. 6 through 8 may be performed after the first ILD 88 is deposited and treated. The embodiment multi-step anneal process are beneficial and can be applied to various structural scenarios related to the first ILD 88. For example, if the widths of the trenches occupied by the first ILD 88 vary greatly (e.g., from 17 nm to 500 nm), or the heights of the trenches are deep (e.g., greater than 200 nm), or the aspect ratios (height over width) of the trenches are high (e.g., between 2 to 40), the embodiment multi-step anneal process may be used to improve the FCVD quality and reduce the total thermal budget for process integration. In some embodiments, the nitrogen concentration (e.g., by atomic percentage) in the first ILD 88 may be less than 1% throughout. Further, the nitrogen concentration in the first ILD 88 may decrease as the depth of the first ILD 88 increases (e.g., in the direction from the top edge of the first ILD 88 to the bottom edge of the first ILD 88 towards the underlying substrate 50). In some embodiments, the decrease of the nitrogen concentration in the first ILD 88 over the depth may be or close to be linear.

In various embodiments, a multi-step anneal process may be utilized to treat a flowable dielectric film to improve the FCVD quality (e.g., in terms of impurity level, density, and etch resistance) and reduce the total thermal budget. The embodiment multi-step anneal process may include a first wet anneal step at a first low temperature for a long anneal time (e.g., for at least five hours), a second wet anneal step at a second temperature higher than the first low temperature, and a third dry anneal step at a third temperature higher than the first low temperature. The embodiment multi-step anneal process can achieve high ratio of FCVD conversion and low nitrogen impurity. The embodiment multi-step anneal process may also reduce the total thermal budget of forming the device layer, thereby reducing the risk of damaging various features of the semiconductor device. The embodiment multi-step anneal process are described with respect to forming of the STI regions and/or the ILD using FCVD. The described embodiment multi-step anneal process may also be applied to forming of any portions of the semiconductor device made of an oxide (e.g., a low-k oxide) using FCVD to improve oxide quality.

In accordance with embodiments, a method includes depositing a flowable dielectric film on a substrate. The flowable dielectric film is deposited between a first semiconductor fin and a second semiconductor fin. The method further includes annealing the flowable dielectric film at a first anneal temperature for an anneal time of at least 5 hours to form a first dielectric film, annealing the first dielectric film at a second anneal temperature higher than the first anneal temperature to form a second dielectric film, annealing the second dielectric film at a third anneal temperature higher than the first anneal temperature to form an insulating layer, applying a planarization process to the insulating layer such that top surfaces of the first semiconductor fin and the second semiconductor fin and a top surface of the insulating layer are level, and etching the insulating layer to form shallow trench isolation (STI) regions on the substrate. In an embodiment, depositing the flowable dielectric film may include reacting flowable precursors at a temperature between 10° C. and 500° C. The flowable precursors may include a $Si_3NH_9$ gas, an $NH_3$ gas, and an $O_2$ gas. In an embodiment, the first anneal temperature may be at most 500° C., and annealing the flowable dielectric film may include exposing the flowable dielectric film to a first gas mixture in a first anneal pressure between 0.01 atmosphere (ATM) and 25 ATM for an anneal time of at least 5 hours. In an embodiment, the first gas mixture may include at least one of $H_2O$, $O_2$, or $N_2$, and an $H_2O$ ratio of the first gas mixture may be between 5% and 100%. In an embodiment, the second anneal temperature may be at most 700° C., and annealing the first dielectric film may include exposing the first dielectric film to a second gas mixture in a second anneal pressure between 0.01 ATM and 25 ATM. In an embodiment, the second gas mixture may include at least one of $O_2$, $N_2$, $H_2+O_2$, $H_2O_2$, $H_2+O_2$ radical, $O_2$ radical, or $H_2O$ radical. In an embodiment, annealing the first dielectric film may include performing at least two annealing substeps at the second annealing temperature. In an embodiment, the third anneal temperature may be at most 800° C., and annealing the second dielectric film may include dry annealing the second dielectric film in an ambient environment including at least one of $O_2$ or $N_2$.

In accordance with embodiments, a semiconductor device includes a substrate, a shallow trench isolation (STI) region made of a material including silicon, oxygen, and nitrogen. The STI region is between the first semiconductor fin and the second semiconductor fin, and a concentration of the nitrogen in the STI region is less than 1% and greater than 0. The semiconductor device further includes one or more gate structures over the STI region, the first semiconductor fin, and the second semiconductor fin. In an embodiment, the concentration of the nitrogen in the STI region may decrease in a direction from a top edge of the STI region to a bottom edge of the STI region. In an embodiment, the semiconductor device may further include an inter-layer dielectric (ILD) around the one or more gate structures. The ILD may be made of a second material including silicon, oxygen, and nitrogen, a concentration of the nitrogen in the ILD may be less than 1% and greater than 0. In an embodiment, the concentration of the nitrogen in the ILD may decrease in a direction from a top edge of the ILD to a bottom edge of the ILD. In an embodiment, an aspect ratio of h1/d1 may be at least 2, wherein h1 is a height of the first semiconductor fin, and wherein d1 is a distance between the first semiconductor fin and the second semiconductor fin. The first semiconductor fin and the second semiconductor fin may be adjacent to each other. In an embodiment, the semiconductor device may further include a third semiconductor fin and a fourth semiconductor fin adjacent to each other. A ratio of d1/d2 is at least 25, wherein d1 is a first distance between the first semiconductor fin and the second semiconductor fin adjacent to each other, and wherein d2 is a second distance between the third semiconductor fin and the fourth semiconductor fin.

In accordance with embodiments, a method includes depositing a flowable dielectric film on a substrate between a first semiconductor fin and a second semiconductor fin and performing a first anneal operation at a first anneal temperature to form a first dielectric film from the flowable dielectric film by exposing a first gas mixture to the flowable dielectric film in a first anneal pressure between 0.01 atmosphere (ATM) and 25 ATM for at least 5 hours. The first gas mixture includes $H_2O$, $O_2$, and $N_2$, and an $H_2O$ ratio of the first gas mixture is between 5% and 100%. The method further includes performing a second anneal operation at a second anneal temperature to form dielectric regions from the first dielectric film. The second anneal temperature is higher than the first anneal temperature, and the second anneal operation is performed for a shorter duration than the first anneal operation. In an embodiment, the method may further include, after performing the first anneal operation and before performing the second anneal operation, performing an intermediate anneal operation at an intermediate anneal temperature to form a second dielectric film, and the intermediate anneal temperature may be higher than the first anneal temperature. In an embodiment, the intermediate anneal temperature may be at most 700° C., and performing the intermediate anneal operation may include exposing the first dielectric film to a second gas mixture in a second anneal pressure between 0.01 ATM and 25 ATM. In an embodiment, the second anneal temperature may be at most 800° C., and performing the second anneal operation may include dry annealing the second dielectric film. In an embodiment, the first anneal temperature may be at most 500° C. In an embodiment, the dielectric regions may be shallow trench isolation (STI) regions above the substrate and between a plurality of semiconductor fins, or the dielectric regions may be inter-layer dielectrics (ILDs).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    depositing a flowable dielectric film on a substrate, wherein the flowable dielectric film is deposited between a first semiconductor fin and a second semiconductor fin;
    annealing the flowable dielectric film at a first anneal temperature for an anneal time of at least 5 hours to form a first dielectric film;
    annealing the first dielectric film at a second anneal temperature higher than the first anneal temperature to form a second dielectric film;
    annealing the second dielectric film at a third anneal temperature higher than the first anneal temperature to form an insulating layer;
    applying a planarization process to the insulating layer such that top surfaces of the first semiconductor fin and the second semiconductor fin and a top surface of the insulating layer are level; and
    etching the insulating layer to form shallow trench isolation (STI) regions on the substrate.

2. The method of claim 1, wherein depositing the flowable dielectric film comprises:
    reacting flowable precursors at a temperature between 10° C. and 500° C., the flowable precursors including a $Si_3NH_9$ gas, an $NH_3$ gas, and an $O_2$ gas.

3. The method of claim 1, wherein the first anneal temperature is at most 500° C., and wherein annealing the flowable dielectric film comprises:
    exposing the flowable dielectric film to a first gas mixture in a first anneal pressure between 0.01 atmosphere (ATM) and 25 ATM for the anneal time of at least 5 hours.

4. The method of claim 3, wherein the first gas mixture includes at least one of $H_2O$, $O_2$, or $N_2$, and wherein an $H_2O$ ratio of the first gas mixture is between 5% and 100%.

5. The method of claim 1, wherein the second anneal temperature is at most 700° C., and wherein annealing the first dielectric film comprises:
    exposing the first dielectric film to a second gas mixture in a second anneal pressure between 0.01 ATM and 25 ATM.

6. The method of claim 5, wherein the second gas mixture includes at least one of $O_2$, $N_2$, $H_2+O_2$, $H_2O_2$, $H_2+O_2$ radical, $O_2$ radical, or $H_2O$ radical.

7. The method of claim 5, wherein annealing the first dielectric film comprises:
    performing at least two annealing sub-steps at the second annealing temperature.

8. The method of claim 1, wherein the third anneal temperature is at most 800° C., and wherein annealing the second dielectric film comprises:
    dry annealing the second dielectric film in an ambient environment including at least one of $O_2$ or $N_2$.

9. A method comprising:
    depositing a flowable dielectric film on a substrate between a first semiconductor fin and a second semiconductor fin;
    performing a first anneal operation at a first anneal temperature to form a first dielectric film from the flowable dielectric film by exposing a first gas mixture to the flowable dielectric film in a first anneal pressure between 0.01 atmosphere (ATM) and 25 ATM for at least 5 hours, wherein the first gas mixture includes $H_2O$, $O_2$, and $N_2$, and wherein an $H_2O$ ratio of the first gas mixture is between 5% and 100%; and
    performing a second anneal operation at a second anneal temperature to form dielectric regions from the first dielectric film, wherein the second anneal temperature is higher than the first anneal temperature, and wherein the second anneal operation is performed for a shorter duration than the first anneal operation.

10. The method of claim 9, further comprising:
    after performing the first anneal operation and before performing the second anneal operation, performing an intermediate anneal operation at an intermediate anneal temperature to form a second dielectric film, wherein the intermediate anneal temperature is higher than the first anneal temperature.

11. The method of claim 10, wherein the intermediate anneal temperature is at most 700° C., and performing the intermediate anneal operation comprises:
    exposing the first dielectric film to a second gas mixture in a second anneal pressure between 0.01 ATM and 25 ATM.

12. The method of claim 10, wherein the second anneal temperature is at most 800° C., and wherein performing the second anneal operation comprises:
    dry annealing the second dielectric film.

13. The method of claim 9, wherein the first anneal temperature is at most 500° C.

14. The method of claim 9, wherein the dielectric regions are shallow trench isolation (STI) regions above the substrate and between a plurality of semiconductor fins, or wherein the dielectric regions are inter-layer dielectrics (ILDs).

15. A method comprising:
    forming a flowable dielectric material between a first semiconductor fin and a second semiconductor fin, wherein a height of the flowable dielectric material is below a height of the first semiconductor fin and the second semiconductor fin;
    annealing the flowable dielectric material with a first wet steam at a first anneal temperature to form a first dielectric film;
    annealing the first dielectric film with a second wet steam at a second anneal temperature higher than the first anneal temperature to form a second dielectric film; and
    annealing the second dielectric film with a dry anneal at a third anneal temperature higher than the first anneal temperature to form an insulating layer.

16. The method of claim 15, wherein the forming of the flowable dielectric material comprises deposition from a silicon containing precursor, an ammonia containing precursor ($NH_3$), and an oxygen containing precursor.

17. The method of claim 15, wherein the forming of the flowable dielectric material comprises recessing the height of the flowable dielectric material to be below the height of the first semiconductor fin and the second semiconductor fin with an etch process before the annealing of the flowable dielectric material with the first wet steam.

18. The method of claim 15, further comprising an ozone treatment to the flowable dielectric material before the annealing of the flowable dielectric material with the first wet steam.

19. The method of claim 15, further comprising an ultra-violet treatment to the flowable dielectric material before the annealing of the flowable dielectric material with the first wet steam.

20. The method of claim 15, wherein the first anneal has a duration for at least 5 hours.

* * * * *